(12) United States Patent
Todorobaru et al.

(10) Patent No.: US 6,503,803 B2
(45) Date of Patent: Jan. 7, 2003

(54) METHOD OF FABRICATING A SEMICONDUCTOR INTEGRATED CIRCUIT DEVICE FOR CONNECTING SEMICONDUCTOR REGION AND ELECTRICAL WIRING METAL VIA TITANIUM SILICIDE LAYER

(75) Inventors: Hiromi Todorobaru, Kashiwa (JP); Hideo Miura, Koshigaya (JP); Masayuki Suzuki, Kokubunji (JP); Shinji Nishihara, Koganei (JP); Shuji Ikeda, Koganei (JP); Masashi Sahara, Kodaira (JP); Shinichi Ishida, Higashimurayama (JP); Hiromi Abe, Tokyo (JP); Atushi Ogishima, Tachikawa (JP); Hiroyuki Uchiyama, Higashimurayama (JP); Sonoko Abe, Higashimurayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/766,645

(22) Filed: Jan. 23, 2001

(65) Prior Publication Data

US 2001/0023958 A1 Sep. 27, 2001

Related U.S. Application Data

(62) Division of application No. 09/500,242, filed on Feb. 8, 2000, which is a division of application No. 08/747,392, filed on Nov. 12, 1996, now Pat. No. 6,031,288.

(30) Foreign Application Priority Data

Nov. 14, 1995 (JP) .............................................. 7-295220
Feb. 20, 1996 (JP) .............................................. 8-031655

(51) Int. Cl.$^7$ ............................................ H01L 21/336

(52) U.S. Cl. ........................ 438/296; 438/637; 438/638; 438/639

(58) Field of Search ................................. 438/683, 438, 438/649, 637, 653, 618, 253; 257/754, 760, 764, 769, 770, 306

(56) References Cited

U.S. PATENT DOCUMENTS 4,562,640 A    1/1986   Widmann et al. ............. 29/591

(List continued on next page.)

FOREIGN PATENT DOCUMENTS

| DE | 4238080 | 5/1993 |
| JP | 7078821 | 3/1995 |
| JP | 7142604 | 6/1995 |

Primary Examiner—David Nelms
Assistant Examiner—Dung Anh Le
(74) Attorney, Agent, or Firm—Antonelli, Terry, Stout & Kraus, LLP

(57) ABSTRACT

Disclosed is a method of fabricating a semiconductor device including forming an insulating film on a silicon substrate; forming a contact hole in the insulating film; depositing a titanium film to be in contact with the silicon substrate in the contact hole; and causing a heat reaction between the titanium film and the silicon substrate such that the titanium film is subjected to silicide reaction with the thickness 4 nm to 48 nm or, more preferably, with the thickness of 8 nm to 34 nm. In the instance where the contact hole is filled with doped polycrystal silicon material, the titanium film is deposited to be in contact with the polycrystal silicon in the contact hole. The silicon substrate/silicon body may have at least a MISFET formed thereon in which case the contact hole is formed to expose an active region of the MISFET, as one example.

32 Claims, 40 Drawing Sheets

U.S. PATENT DOCUMENTS

| | | | |
|---|---|---|---|
| 4,829,024 A | * 5/1989 | Klein et al. | 438/653 |
| 4,914,500 A | 4/1990 | Liu et al. | 357/67 |
| 4,994,410 A | * 2/1991 | Sun et al. | 438/649 |
| 5,166,771 A | 11/1992 | Godinho et al. | 257/754 |
| 5,382,533 A | 1/1995 | Ahmad et al. | 438/301 |
| 5,414,301 A | 5/1995 | Thomas | 257/764 |
| 5,475,240 A | 12/1995 | Sakamoto | 257/756 |
| 5,484,747 A | 1/1996 | Chien | |
| 5,486,481 A | 1/1996 | Sundaram | |
| 5,506,166 A | * 4/1996 | Sandhu et al. | 438/438 |
| 5,565,708 A | 10/1996 | Ohsaki et al. | 257/64 |
| 5,661,061 A | 8/1997 | Usuami et al. | 438/254 |
| 5,683,515 A | 11/1997 | Nakajima et al. | 118/715 |
| 5,776,814 A | 7/1998 | Beasom | 438/364 |
| 5,801,095 A | 9/1998 | Huang et al. | 438/627 |
| 5,834,846 A | 11/1998 | Shinriki et al. | 257/754 |
| 5,851,912 A | 12/1998 | Liaw et al. | 438/621 |
| 5,893,734 A | 4/1999 | Jeng et al. | 438/239 |
| 5,918,120 A | 6/1999 | Huang | 438/239 |

* cited by examiner

TiSix CRITICAL THICKNESS AGAINST CONTACT HOLE DIA.

RELATION BETWEEN TiSix THICKNESS AND CONTACT
RESISTANCE OF p-TYPE SEMICONDUCTOR SUBSTRATE

ANNEALING

METHOD OF FABRICATING A SEMICONDUCTOR INTEGRATED CIRCUIT DEVICE FOR CONNECTING SEMICONDUCTOR REGION AND ELECTRICAL WIRING METAL VIA TITANIUM SILICIDE LAYER

This application is a Divisional of U.S. application Ser. No. 09/500,242, filed Feb. 8, 2000, which in turn, is a Divisional of U.S. application Ser. No. 08/747,392, filed Nov. 12, 1996, and now U.S. Pat. No. 6,031,288; and the subject matters of which are incorporated herein in its entirety.

BACKGROUND OF THE INVENTION

The present invention relates to a semi-conductor integrated circuit device and a fabrication technique thereof or, more particularly to a technique effectively applicable to a semiconductor integrated circuit device comprising a DRAM (dynamic random access memory) having a memory cell of stacked capacitor structure with an information storage capacitor arranged on a memory cell-selecting MISFET and also to a technique for connecting a semiconductor region and an electrical wiring metal to each other through a titanium (Ti) silicide layer.

In order to compensate for the reduction in the accumulated charge (Cs) of the information storage capacitor with the miniaturization of the memory cell, a large-capacity DRAM recently developed has a stacked capacitor structure with an information storage capacitor above a memory cell-selecting MISFET.

The information storage capacitor of stacked capacitor structure is formed by depositing a storage electrode (lower electrode), a capacitive insulating film and a plate electrode (upper electrode) in that order. The storage electrode of the information storage capacitor is composed of polycrystal silicon doped with n-type impurities (phosphorus) and is connected to one of the semiconductor regions (source and drain regions) of a memory cell-selecting n-channel MISFET. The plate electrode is composed as an electrode shared by a plurality of memory cells and is supplied with a predetermined fixed potential.

A bit line for writing and reading data is arranged above the memory cells. The bit line is connected to the other one of the semiconductor regions (source and drain regions) of the memory cell-selecting MISFET through a contact hole opened to an insulating film covering the memory cells. The bit line is composed of a low-resistance metal material in order to assure high-speed data write and read operation.

The height (from the substrate surface) of the memory array of the DRAM having memory cells of stacked capacitor structure described above is greater than that of the peripheral circuit by an amount substantially equal to the height of the information storage capacitor. As a result, with the miniaturization of the memory cell, the aspect ratio between the semiconductor regions of the memory cellselecting MISFET and the contact holes for connecting the bit line is considerably increased, thereby making it difficult to deposit a metal material for the bit line sufficiently in the contact holes.

One known solution attempt at overcoming this problem is with regard, to the DRAM described in JP-A-7-142604, which corresponds to U.S. patent application Ser. No. 08/341966 filed on Nov. 16, 1994, and which is fabricated by employing a polycrystalline silicon plug technique in which a polycrystal silicon film of the same conductivity type (n-type) as that of the semiconductor regions of the memory cell-selecting MISFET is filled in the contact holes. In this technique, contact holes reaching the semiconductor regions of a memory-cell selecting MISFET are formed through an insulating film covering memory cells, a sufficient amount of polycrystal silicon film is filled in each contact hole using the CVD process having a superior step coverage, and then an unrequired polycrystal silicon film remaining on the insulating film is removed by etching (etch back).

The use of a (n-type) polycrystal silicon film as a plug material filled in the contact hole is effective not only as a measure to secure the conduction of the bit line but also to reduce the memory cell size. Specifically, the DRAM with a reduced memory cell size has such a miniscule diameter of the contact hole for the bit line that in the case where a mask misalignment occurs between the contact hole and the semiconductor regions of the memory cell-selecting MISFET when opening the contact hole by etching with photoresist as a mask, the contact area between the semiconductor regions and the plug material filled subsequently in the contact hole is reduced resulting in an increased contact resistance. In the case where a polycrystal silicon film of the same conductivity type (n-type) as the semiconductor regions is used as a plug material, by contrast, the (n-type) impurities in the polycrystal silicon film are diffused into the substrate and the contact resistance is reduced. The mask alignment margin can thus be reduced between the semiconductor regions and the contact holes.

Also, in the DRAM disclosed in the above-mentioned patent publication, the bit line is composed of a tungsten (W) film, and the first layer of wiring connected to the semiconductor regions (source and drain regions) of a complementary MISFET (CMOSFET) constituting the peripheral circuits is composed of a W film in the same layer as the bit line.

Using tungsten (W) for the wiring of the first layer of the peripheral circuit and for the bit line provides a high electromigration endurance as compared with wirings formed of aluminum (Al), thereby resulting in an improvement in the wiring life of a miniaturized DRAM. The above-mentioned technique of filling a polycrystalline silicon plug in the bit-line contact holes is indispensable for constructing the bit line and the first layer of the peripheral circuit by the W film in the same layer. This is by reason of the fact that in the case where the plug material is not filled in the bit-line contact hole, it is necessary to fill the plug material in the (bit-line) contact hole of a very large aspect ratio and the contact hole (for the peripheral circuit) small in aspect ratio at the same time, thereby increasing the process burden. The above-mentioned scheme, however, fails to describe anything about the formation of a Ti silicide layer.

The present inventors have thoroughly examined the problems which occur when forming the first layer of the wiring of the peripheral circuit and the bit line in the same layer of a W film in a DRAM having memory cells of stacked capacitor structure. The findings of this effect are described briefly below.

Generally, a W film is known to have a low adherence to an insulating film such as a silicon oxide film. Also, at a contact point between the wiring and the substrate, the metal material constituting the wiring and the silicon constituting the substrate react with each other to form a silicide layer. The silicide (tungsten silicide) layer produced by the reaction between the W film and the silicon substrate exerts a great stress on the substrate. As a result, in the case where the first layer of the wiring of the peripheral circuit is composed of a W film, therefore, it is necessary to form under the W film such a metal film that forms a silicide layer to provide a high quality adherence to the insulating film and exerta small stress when reacting with the silicon substrate.

Titanium (Ti) has a superior adherence to an insulating film, and the Ti silicide (TiSix, $x \leq 2$) formed by reaction with the silicon substrate exerts only a small stress on the substrate. Therefore, titanium provides a suitable material as a metal film formed under the W film. Also, to form a Ti silicide layer in the interface between the first layer of wiring and the semiconductor regions (source and drain regions) of the MISFET constituting the peripheral circuit is an effective measure for reducing the contact resistance of the wiring.

The Ti film, however, poses the problem that it reacts with $WF_6$ making up a source gas produced when depositing the W film by the DVD process and forms an undesirable reaction layer on the film surface. In the case where a W film is deposited on the Ti film, therefore, a barrier layer which is resistant to reaction with $WF_6$ and having a high adherence with both the Ti film and the W film is required to be formed between the Ti film and the W film. A preferable barrier layer is a TiN (titanium nitride) film.

A method of forming the first layer of wiring of the peripheral circuit and the bit line at the same time with a W—TiN—Ti film lamination is as follows. First, a polycrystalline silicon plug is filled in the bit-line contact holes formed in an insulating film covering memory cells, and then contact holes are formed in the insulating film covering a MISFET of the peripheral circuit. As the next step, a Ti film and a TiN film are deposited continuously by sputtering on the insulating film. The substrate is annealed in the nitrogen environment, so that the reaction is caused between the Ti film and the silicon (substrate) thereby to form a Ti silicide layer in the interface between the Ti film and the silicon substrate. After that, a W film is deposited by CVD on the TiN film. The W film and the underlying TiN and Ti films are patterned by etching with a photoresist as a mask thereby to form the first layer of wiring of the peripheral circuit and the bit line.

The present inventors, after examining the above-mentioned process further, have found the following problems.

As described above, in the process of forming the first layer of wiring of the peripheral circuit and the bit line by a W—TiN—Ti film lamination, the polycrystalline silicon plug is filled in the bit-line contact holes in advance of the deposition of a TiN—Ti film. In forming a Ti silicide layer in the interface between the Ti film and the silicon substrate by annealing the substrate, therefore, a Ti silicide layer is formed in the interface between the polycrystalline silicon plug and the Ti film in the bit-line contact holes.

Once the Ti silicide layer is formed on the polycrystalline silicon plug, however, the interface between the polycrystalline silicon plug and the Ti silicide layer may be separated, often causing a conduction failure of the bit line. An examination of the cause has led to the finding that there is a correlation between the separation frequency and the thickness of the Ti silicide layer formed on the polycrystalline silicon plug.

FIG. 25 is a graph showing the result of study made on the relation between the thickness of the Ti silicide layer and the interface separation. As shown in FIG. 25, separation occurs for the thickness of the Ti silicide layer higher than a certain value. The smaller the diameter of the contact hole, the smaller the thickness with which the separation occurs. A possible cause of this separation is that with the increase in the thickness of the Ti silicide layer, the interface between the polycrystalline silicon plug and the Ti silicide layer is subjected to the stress due to the volume reduction caused by the formation of the Ti silicide layer and the stress due to the crystallization of the TiN film.

In the case where the Ti silicide layer is formed in the interface between the Ti film and the silicon substrate, on the other hand, the contact resistance would undesirably increase unless a certain degree of thickness is secured of the Ti silicide layer. Especially in the case where a Ti silicide layer is formed on the surface of the source and drain regions (p-type semiconductor regions) of a p-channel MISFET, as shown in FIG. 26, a decreased thickness of the Ti silicide layer is found to increase the contact resistance considerably.

A conventional technique for reducing the resistance of the contact section for electrically connecting the surface of a silicon substrate and a metal wiring is disclosed, for example, in JP-A-07-78821 (hereinafter referred to the well-known example), in which a titanium silicide film is formed between the silicon substrate and the metal wiring.

With the increase in the thickness of the titanium silicide film and also with the decrease in the diameter of the contact hole, however, the titanium silicide film is more easily separated, which is a stumbling block to higher integration and miniaturization of a semiconductor device.

For a low contact resistance to be obtained by forming a silicide film in the interface between silicon and a metal, the titanium silicide film formed (especially, $TiSi_2$ di-silicide) is required to have a certain degree of thickness. Since titanium silicide is formed by heat treatment of the silicon deposited with a titanium film thereon, however, the volume change of the film generates a stress in the film.

This internal stress of the film increases the stress generated in the neighborhood of the interface between the titanium silicide film and the silicon. Experiments and analyses have made it clear that the average stress generated in the interface increases with the decrease in the size of the contact hole and also with the increase in the thickness of the titanium silicide layer, thereby causing the separation of the titanium silicide film.

As described above, in the case where a polycrystalline silicon plug is filled in the bit-line contact hole to form the first layer of wiring of the peripheral circuit and a bit line at the same time with a W—TiN—Ti film lamination, it is difficult to secure the conduction reliability of the bit line and to reduce the contact resistance of the wiring connected to the source and drain regions of the MISFET of the peripheral circuit at the same time.

SUMMARY OF THE INVENTION

An object of the present invention is to provide a semiconductor device and a method of fabrication thereof, in which a titanium silicide film is not easily separated in the connection interface between a titanium silicide film and silicon in a contact hole.

Another object of the invention is to provide, in a DRAM comprising memory cells of stacked capacitor structure and a W—TiN—Ti film lamination constituting a first layer of wiring of the peripheral circuit and a bit line, a technique in which the conduction reliability of the bit line connected to a memory cell-selecting MISFET is secured while at the same time reducing the contact resistance of the wiring connected to the MISFET of the peripheral circuit.

The above-mentioned first object is achieved by a semiconductor device with silicon and an electrical wiring metal are connected to each other through a titanium silicide film in a contact hole formed in an insulating film, wherein the thickness of the titanium silicide film is set to 10 to 120 nm, or preferably, to 20 to 84 nm.

The second object of the invention is achieved by a semiconductor device, in which an insulating film is formed on a silicon substrate, at least a contact hole is formed in the insulating film, a titanium film is deposited in such a manner as to contact the silicon substrate in the contact hole, and the titanium film is heat treated with the silicon, thereby attaining the thickness of the titanium film in the range of 4 to 48 nm, or preferably, 8 to 34 nm by silicide reaction.

The titanium film includes a metal film containing a component other than titanium in addition to titanium.

A semiconductor integrated circuit device according to an embodiment of the invention comprises memory cells of stacked capacitor structure with an information storage capacitor arranged above a memory cell-selecting MISFET, wherein a polycrystalline silicon plug of the same conductivity type as the semiconductor regions of the memory cell-selecting MISFET is formed in the contact holes connecting the semiconductor regions and the bit line, the bit line and the wiring connected to the semiconductor regions of the MISFET of the peripheral circuit are composed of the same triple layer of a W—TiN—Ti film, and a Ti silicide film is formed on the surface of the semiconductor regions of the MISFET of the peripheral circuit and on the surface of the polycrystalline silicon plug in the contact holes.

Specifically, the thickness of the Ti silicide film formed on the surface of the polycrystalline silicon plug in the contact hole is set to about 120 nm or less, and the thickness of the Ti silicide film formed on the surface of the semiconductor regions of the MISFET of the peripheral circuit to about 10 nm or more, or more preferably, to about 20 nm or more.

The numerical values of the film thickness and the hole diameter specified above should not be considered as strict values but as containing an error of Max±10% as working tolerance.

A method of fabricating a DRAM as a semi-conductor integrated circuit device having memory cells of stacked capacitor structure with an information storage capacitor arranged above a memory cell-selecting MISFET according to the present invention comprises:

(a) the step of forming a MISFET of a peripheral circuit and a memory cell-selecting MISFET on a plurality of memory cells on a semiconductor substrate, forming a MISFET of the peripheral circuit and then forming an information storage capacitor above the memory cell-selecting MISFET;

(b) the step of forming a hole for connecting the bit line in an insulating film covering the memory cells, filling a polycrystalline silicon plug of the same conductivity type as the semiconductor regions of the memory cell-selecting MISFET in the bit-line contact holes, and forming at least a contact hole in the insulating film covering the MISFET of the peripheral circuit;

(c) the step of depositing a Ti film and a TiN film on the insulating film, annealing the semiconductor substrate, forming a Ti silicide layer having a thickness of about 120 nm or less on the surface of the polycrystalline silicon plug in the bit-line contact holes, and forming a Ti silicide layer having a thickness of about 10 nm or more or, preferably, about 20 nm or more on the surface of the semiconductor regions of the MISFET exposed to the bottom of the contact holes of the peripheral circuit; and (d) the step of depositing a W film on the TiN film, patterning the W film and the underlying TiN and Ti films, and forming a bit line and the first layer of wiring of the peripheral circuit composed of a W—TiN—Ti film lamination.

According to the present invention, there is provided a semiconductor device comprising silicon and an electrical wiring metal connected to each other through a titanium silicide film in a contact hole formed in an insulating film, wherein the thickness of the titanium silicide film is set to 10 to 120 nm or, preferably, to 20 to 84 nm, whereby the contact resistance between the silicon and the metal wiring can be reduced and a superior contact can be formed free of any anxiety of breakage of the interface between the silicon and the titanium silicide.

According to the present invention, there is provided a DRAM comprising a plurality of memory cells of stacked capacitor type, wherein a polycrystalline silicon plug of the same conductivity type as that of the semiconductor regions of a memory cell-selecting MISFET is formed in a contact hole for connecting the semiconductor regions and a bit line, and the bit line and the first layer of wiring connected to the semiconductor regions of the MISFET of the peripheral circuit are composed of the same wiring layer of a W—TiN—Ti film, thereby securing the conduction reliability of the bit line while at the same time reducing the contact resistance of the wiring connected to the source and drain regions of the MISFET of the peripheral circuit.

DESCRIPTION OF THE PREFERRED EMBODIMENTS

Figure 1:
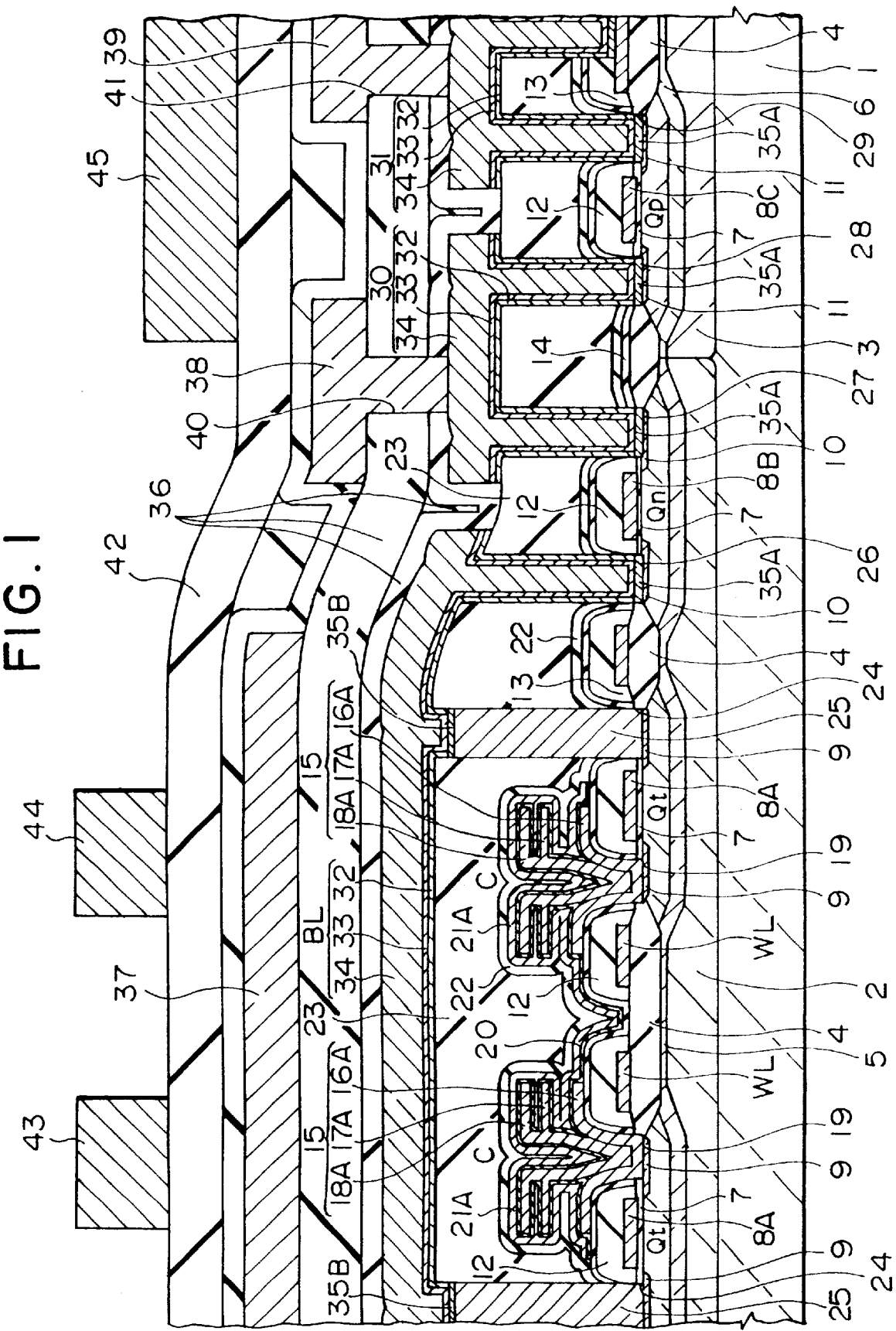
FIG. 1 is a partial sectional view of a DRAM according to an embodiment of the present invention.

Embodiments of the invention will be explained below with reference to the accompanying drawings. In all the drawings for explaining the embodiments, the component parts having the same function will be designated by the same reference numerals respectively, and will not be described twice.

FIG. 1 is a sectional view showing a part of a memory array and a peripheral circuit of a DRAM according to an embodiment of the present invention. The method of fabricating them will be described later.

The main surface of a semiconductor substrate 1 composed of p-type single crystal silicon is formed with a p-type well 2 shared by the memory array and the peripheral circuit, and a n-type well 3 of the peripheral circuit. The main surfaces of each of the p-type well 2 and the n-type well 3 are formed with an element-isolating field oxide film 4. The p-type well 2 including the lower part of the field oxide film 4 has formed therein a p-type channel stopper layer 5, and a n-type channel stopper layer 6 is formed in the n-type well 3.

A plurality of memory cells of the DRAM are formed in the active region of the p-type well 2 of the memory array. Each memory cell includes a memory cell-selecting MISFET Qt of n-channel type and a single information storage capacitor C arranged above it. Specifically, a memory cell has a stacked capacitor structure with the information storage capacitor C arranged above the memory cell-selecting MISFET Qt.

The memory cell-selecting MISFET Qt of the memory cell includes a gate oxide film 7, a gate electrode 8A and a pair of n-type semiconductor regions 9, 9 (source and drain regions). The gate electrode 8A includes a first layer of polycrystal silicon film integrally formed with a word line WL. The polycrystal silicon film constituting the gate electrode 8A and the word line WL is doped with n-type impurities (such as phosphorus) for reducing the resistance value.

The active region of the p-type well 2 of the peripheral circuit region is formed with a n-channel MISFET Qn, and the active region of the n-type well 3 with a p-channel MISFET Qp. Specifically, the peripheral circuit of the DRAM is composed of a CMOS circuit constituting a combination of the n-channel MISFET Qn and the p-channel MISFET Qp. The n-channel MISFET Qn includes a gate oxide film 7, a gate electrode 8B and a pair of n-type semiconductor regions 10, 10 (source and drain regions), and the p-channel MISFET Qp includes a gate oxide film 7, a gate electrode 8C and a pair of p-type semiconductor regions (source and drain regions). The gate electrode 8B of the n-channel MISFET Qn and the gate electrode 8C of the p-channel MISFET Qp are composed of the same first layer of a polycrystal silicon film as the gate electrode 8A (and the word line WL) of the memory cell-selecting MISFET Qt.

A silicon oxide film 12 is formed above the gate electrode 8A of the memory cell-selecting MISFET Qt, the gate electrode 8B of the n-channel MISFET Qn and the gate electrode 8C of the p-channel MISFET Qp, respectively. A side wall spacer 13 of silicon oxide is formed on the sides of each electrode. A silicon oxide film 14 is formed above the silicon oxide film 12 and the side wall spacer 13.

An information storage capacitor C is formed above the silicon oxide film 14 covering the memory cell-selecting MISFET Qt. The information storage capacitor C includes a storage electrode 15, a capacitive insulating film 20 and a plate electrode 21A.

The storage electrode 15 of the information storage capacitor C includes fins 16A, 17A and 18A in three layers. The first layer (lower layer) of the fin 16A is composed of a polycrystal silicon film of the second layer, the second layer (intermediate layer) of the fin 17A is composed of the third layer of the polycrystal silicon film, and the third layer (upper layer) of the fin 18A is composed of the fourth layer of the polycrystal silicon film. The storage electrode 15 is connected to the first n-type semiconductor regions 9 of the memory cell-selecting MISFET Qt through a contact hole 19 formed in the silicon oxide film 12 and the gate oxide film 7. In FIG. 1, the gate oxide film 7, the silicon oxide film 12 and side wall spacer 13 are formed of the same material $SiO_2$, and therefore the interface thereof is not shown.

The capacitive insulating film 20 formed above the storage electrode 15 is composed of a silicon nitride film. The plate electrode 21A formed above the capacitive insulating film 20 is composed of a polycrystal silicon film of the fifth layer.

A silicon oxide film 22 and a BPSG (boron-doped phospho-silicate glass) film 23 are formed above the information storage capacitor C of the memory cell and the n-channel MISFET Qn and the p-channel MISFET Qp of the peripheral circuit, respectively.

The second n-type semiconductor region 9 of the memory cell-selecting MISFET Qt is connected to a bit line BL through a contact hole 24 formed in the BPSG film 23, the silicon oxide films 22, 14 and the gate oxide film 7. A polycrystalline silicon plug 25 is filled in this contact hole 24, and the bit line BL is connected to the n-type semiconductor region 9 via the polycrystalline silicon plug 25.

The first n-type semiconductor region 10 of the n-channel MISFET Qn of the peripheral circuit is connected to the bit line BL through a contact hole 26 formed in the gate oxide film 7, the silicon oxide films 22, 14 and the BPSG film 23. Also, the second n-type semiconductor region 10 of the n-channel MISFET Qn is connected to the first layer of wiring 30 through a contact hole 27 formed in the gate oxide film 7, the silicon oxide films 22, 14 and the BPSG film 23.

The first p-type semiconductor region 11 of the p-channel MISFET Qp of the peripheral circuit is connected to the first layer of wiring 30 through a contact hole 28 formed in the gate oxide film 7, the silicon oxide films 22, 14 and the BPSG film 23. Also, the second p-type semiconductor region 11 of the p-channel MISFET Qp is connected to the first layer of wiring 31 through a contact hole 29 formed in the gate oxide film 7, the silicon oxide films 22, 14 and the BPSG film 23.

The bit line BL and the first layer of wirings 30, 31 are composed of a lamination structure including a Ti film 32, a TiN film 33 and a W film deposited in that order from the bottom, and are arranged in the same wiring layer. The surface of the polycrystalline silicon plug 25 formed in the contact hole 24 connecting the bit line BL and the n-type semiconductor region 9 of the memory cell-selecting MISFET Qt is formed with a Ti silicide layer 35B by the reaction between the polycrystal silicon and the Ti film 32 making up a part of the bit line BL. Also, a Ti silicide layer 35A formed by the reaction between the silicon substrate (n-type semiconductor region 10) and the Ti film 32 constituting a part of the wiring 30 is formed on the bottom of the contact hole 27 connecting the first layer of wiring 30 and the n-type semiconductor region 10 of the n-channel MISFET Qn of the peripheral circuit. In similar fashion, a Ti silicide layer 35A is formed by the reaction between the silicon substrate (p-type semiconductor region 11) and the Ti film 32 constituting a part of the wiring 31 on the bottom of the contact holes 28, 29 connecting the first layer of wiring 31 and the p-type semiconductor region 11 of the p-channel MISFET Qp.

The thickness of the Ti silicide layer 35B formed on the surface of the polycrystalline silicon plug 25 is about 125 nm or less for preventing the separation of the interface between the polycrystalline silicon plug 25 and the Ti silicide layer 35B. In contrast, the thickness of the Ti silicide layer 35A formed on the surface of the p-type semiconductor region 11 of the p-channel MISFET Qp is about 10 nm or more in order to reduce the contact resistance between the wiring 31 and the p-type semiconductor region 11.

A first layer of a layer insulating film 36 is formed above the first layer of wirings 30, 31 and the bit line BL. This layer insulating film 36 includes, for example, three layers of a silicon oxide film, a spin-on-glass film and a silicon oxide film.

The first layer of the layer insulating film 36 is formed with the second layer of wirings 37, 38, 39. The material of the second layer of wirings 37, 38, 39, though not specifically limited, is an Al alloy single-layer film with silicon or copper (Cu) added thereto or a laminated film with TiN or other barrier metal deposited above and under an Al alloy. The wiring 37 arranged above the memory array is composed of a shunt word line, for example. One of the wirings 38, 39 (wiring 38) arranged above the peripheral circuit is connected to the first layer of the wiring 30 through a contact hole 40 formed in the layer insulating film 36, and the other wiring 39 is connected to the first layer of the wiring 31 through a contact hole 41 formed in the layer insulating film 36.

The layer above the second layer of the wirings 37, 38, 39 is formed with the second layer of the layer insulating film 42. This layer insulating film 42, like the first layer of the layer insulating film 36, for example, is composed of a three-layered insulating film deposited with a silicon oxide film, a spin-on-glass film and a silicon oxide film in that order.

The layer above the second layer insulating film 42 is formed with the third layer of the wirings 43, 44, 45. The material of the third layer of the wirings 43, 44, 45, though not specifically limited, is an Al alloy single-layer film or a laminated film with a barrier metal such as TiN deposited above and under an Al alloy, for example similarly to the second layer of the wirings 37, 38 and 39. The wiring 43 arranged above the memory array constitutes, for example, a Y-select line.

The layer above the third layer of the wirings 43, 44, 45 is formed with a passivation layer composed of a lamination of a silicon oxide film and a silicon nitride film. The passivation film is formed with a protective film such as of polyimide resin as required, though not shown.

Now, an example of a method of fabricating a DRAM having the above-mentioned structure will be explained with reference to FIGS. 2 to 24.

Figure 2:
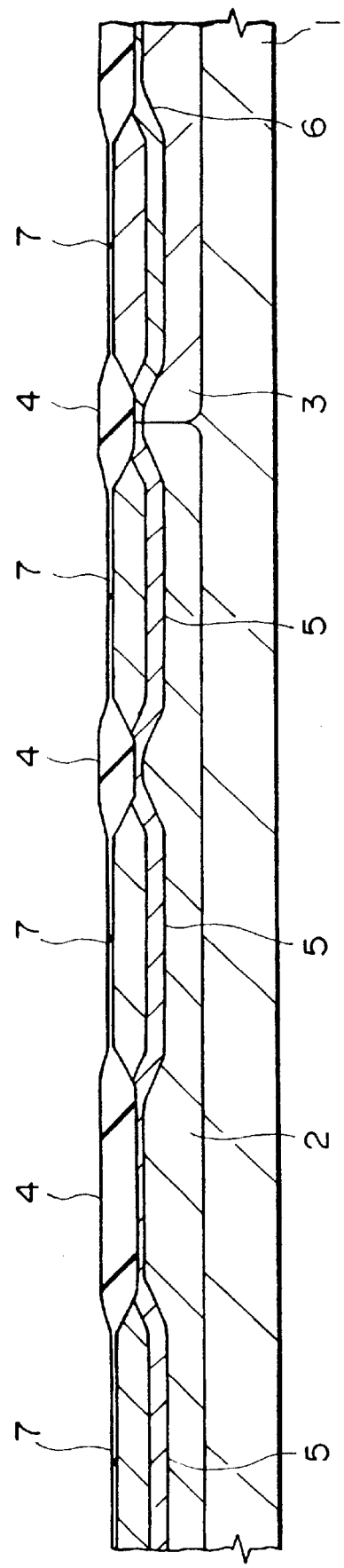
FIG. 2 is a diagram for explaining the initial steps of fabricating the DRAM of FIG. 1.

First, as shown in FIG. 2, a part of the main surface of the semiconductor substrate 1 is formed with a n-type well 3 by injecting ions of a n-type impurities (phosphorus), and another part thereof is formed with a p-type well 2 by injecting ions of p-type impurities (boron). After that, the surfaces of the p-type well 2 and the n-type well 3 are formed with a field oxide film 4 by selective oxidization (LOCOS). Then, p-type impurities (boron) are ion-implanted in the p-type well 2, and n-type impurities (phosphorus) in the n-type well 3, after which these impurities are diffused by annealing the semiconductor substrate 1. A p-type channel stopper layer 5 thus is formed in the p-type well 2, and a n-type channel stopper layer 6 in the n-type well 3. After that, the surfaces of the active regions of the p-type well 2 and the n-type well 3 surrounded by the field oxide film 4 are thermally oxidized and formed respectively with a gate oxide film 7.

Figure 3:
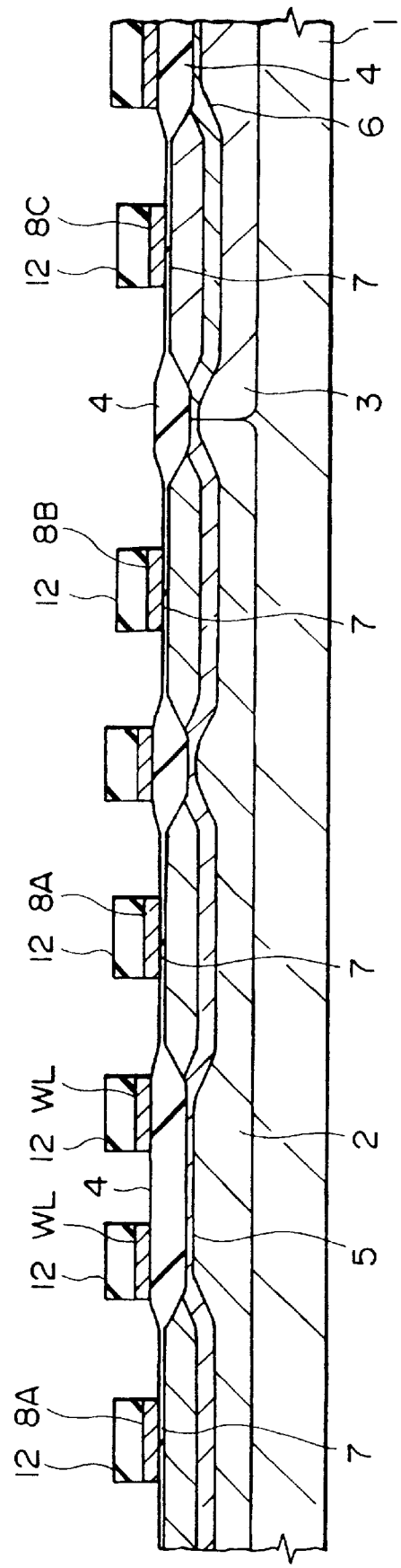
FIG. 3 is a diagram for explaining the fabrication steps following FIG. 2.

The next step, as shown in FIG. 3, is to form a gate electrode 8A (word line WL) of the memory cell-selecting MISFET Qt, a gate electrode 8B of the n-channel MISFET Qn and a gate electrode 8C of the p-channel MISFET Qp. The gate electrodes 8A (word line WL), 8B, 8C are formed at the same time by sequentially depositing the first layer of a polycrystal silicon film and a silicon oxide film 12 by CVD on the semiconductor substrate 1 and then patterning the silicon oxide film 12 and the polycrystal silicon film by etching with a photoresist as a mask. The polycrystal silicon film is deposited by use of a mixed gas of $SiH_4$ and $PH_3$ and by doping it with phosphorous in situ.

Figure 4:
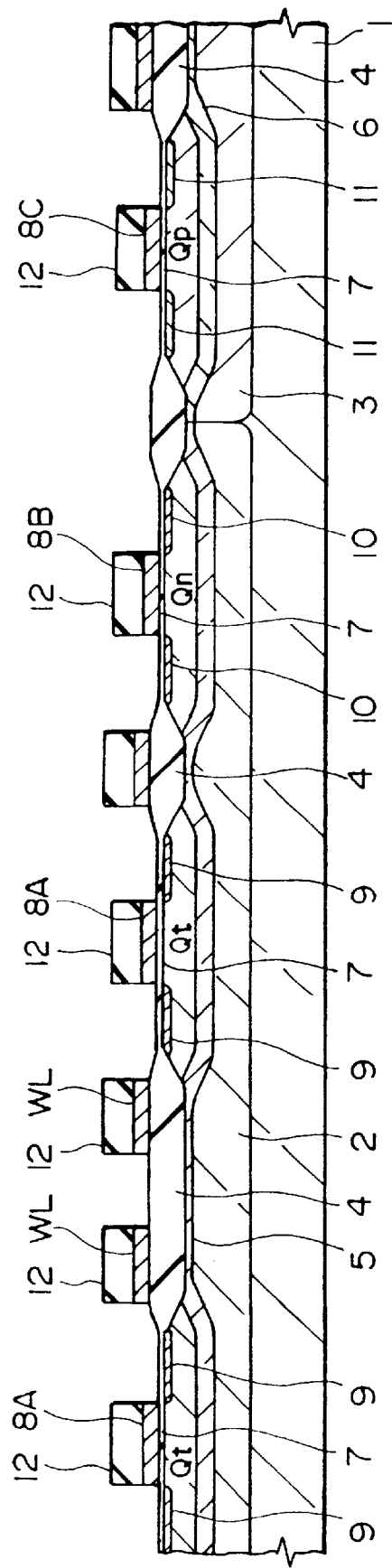
FIG. 4 is a diagram for explaining the fabrication steps following FIG. 3.

Then, as shown in FIG. 4, n-type impurities (phosphorus) are ion-implanted in the p-type well 2 thereby to form the n-type semiconductor regions 9, 9 constituting the source and drain regions of the memory cell-selecting MISFET Qt and the n-type semiconductor regions 10, 10 constituting the source and drain regions of the n-channel MISFET Qn. Also, the p-type semiconductor regions 11, 11 constituting the source and drain regions of the p-channel MISFET Qp are formed by ion-implanting p-type impurities (boron) into the n-type well 3.

Figure 5:
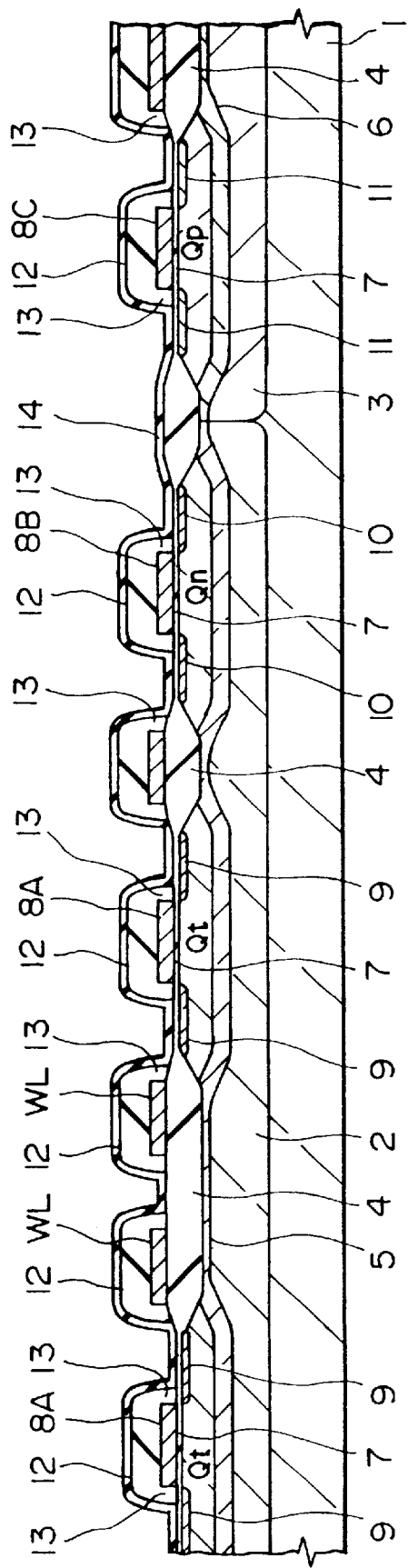
FIG. 5 is a diagram for explaining the fabrication steps following FIG. 4.

As shown in FIG. 5, a side wall spacer 13 is formed on each side wall of the gate electrode 8A (word line WL) of the memory cell-selecting MISFET Qt, the gate electrode 8B of the n-channel MISFET Qn and the gate electrode 8C of the p-channel MISFET Qp. After that, a silicon oxide film 14 is formed by CVD over the entire surface of the semiconductor substrate 1. The side wall spacer 13 is formed by depositing a silicon oxide film by the CVD process over the entire surface of the semiconductor substrate 1 and by processing the silicon oxide film by anisotropic etching.

Figure 6:
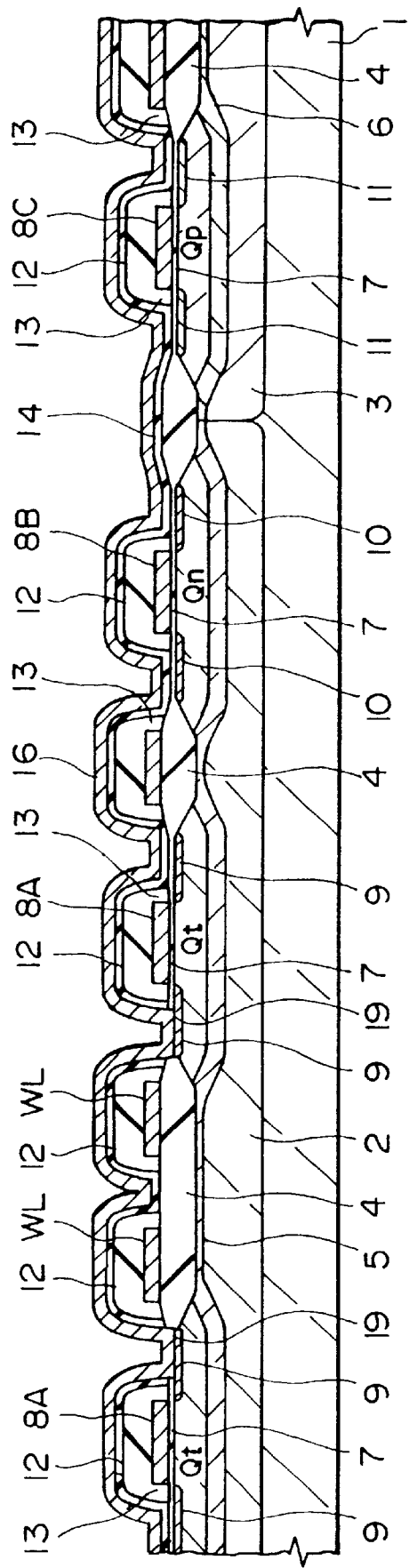
FIG. 6 is a diagram for explaining the fabrication steps following FIG. 5.

Next, as shown in FIG. 6, the silicon oxide film 14 and the gate oxide film 7 are formed by etching with a photoresist as a mask, so that a contact hole 19 reaching the n-type semiconductor region 9 of the memory cell-selecting MISFET Qt is formed. After that, the second layer of the polycrystal silicon film 16 is deposited by the CVD process over the entire surface of the semiconductor substrate 1. The polycrystal silicon film 16 is doped with n-type impurities (phosphorus) like the first layer of the polycrystal silicon film.

Figure 7:
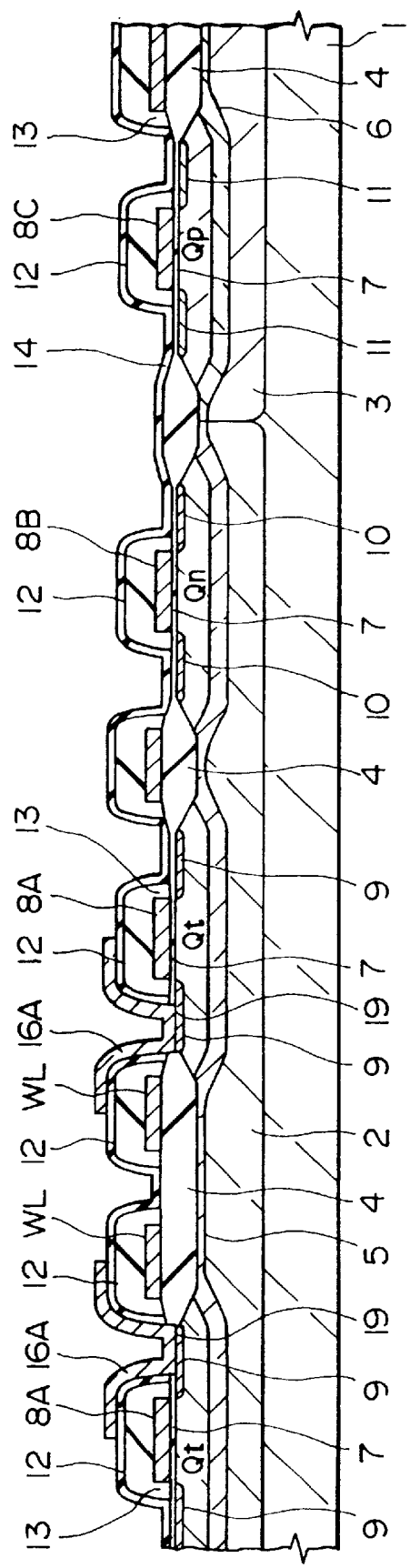
FIG. 7 is a diagram for explaining the fabrication steps following FIG. 6.

Then, as shown in FIG. 7, the polycrystal silicon film 16 is patterned by etching with a photoresist as a mask thereby to form the first layer of the fin 16A constituting a part of a storage electrode 15. The first layer of the fin 16A is connected to the n-type semiconductor region 9 of the memory cell-selecting MISFET Qt through the contact hole 19.

Figure 8:
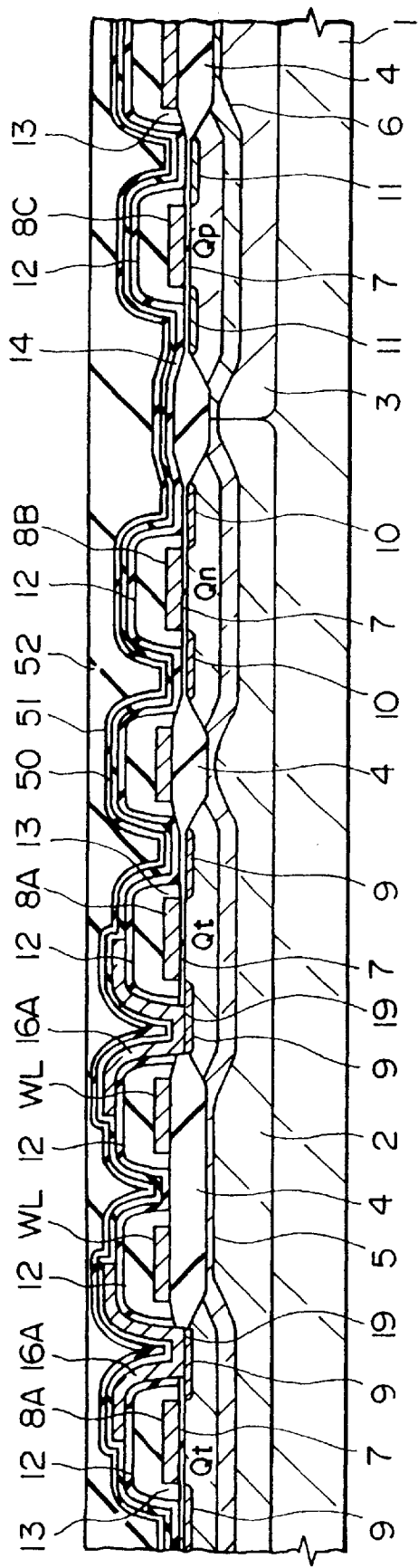
FIG. 8 is a diagram for explaining the fabrication steps following FIG. 7.

Then, as shown in FIG. 8, a silicon nitride film 50, a silicon oxide film 51 and a BPSG film 52 are sequentially deposited by the CVD process over the entire surface of the semiconductor substrate 1, after which the surface of the BPSG film 52 is subjected to reflow by annealing the semiconductor substrate 1. Then, the surface of the BPSG film 52 is flattened by etch back.

Figure 9:
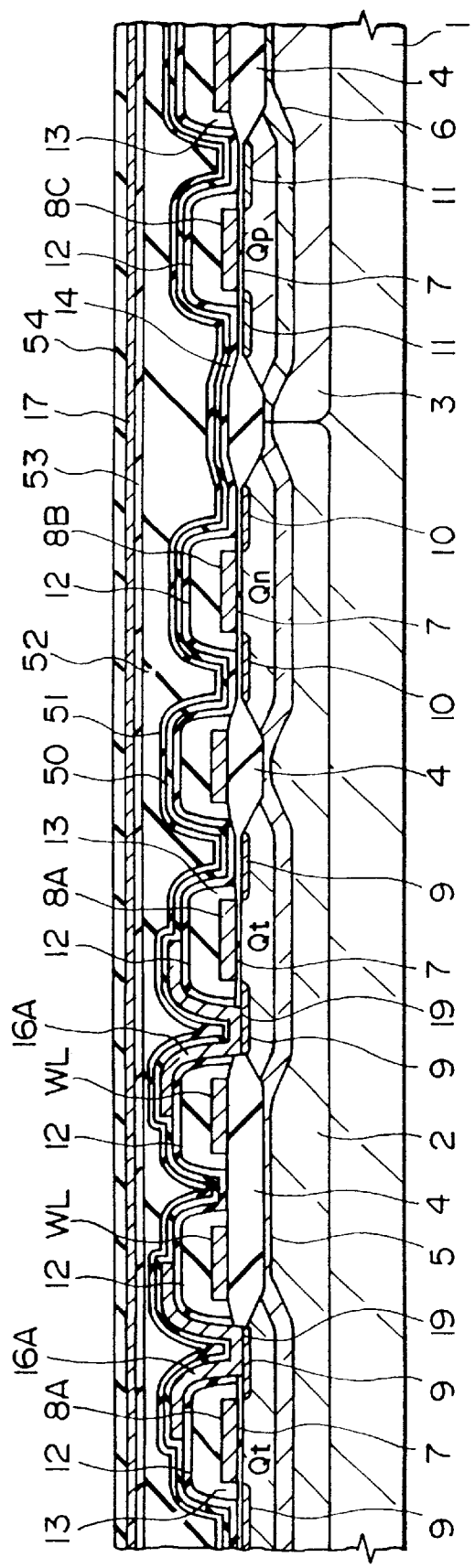
FIG. 9 is a diagram for explaining the fabrication steps following FIG. 8.

As shown in FIG. 9, a silicon oxide film 53, the third layer of the polycrystal silicon film 17 and a silicon oxide film 54 are sequentially deposited by the CVD process on the BPSG film 52. The polycrystal silicon film 17 is doped with n-type impurities (phosphorus).

Figure 10:
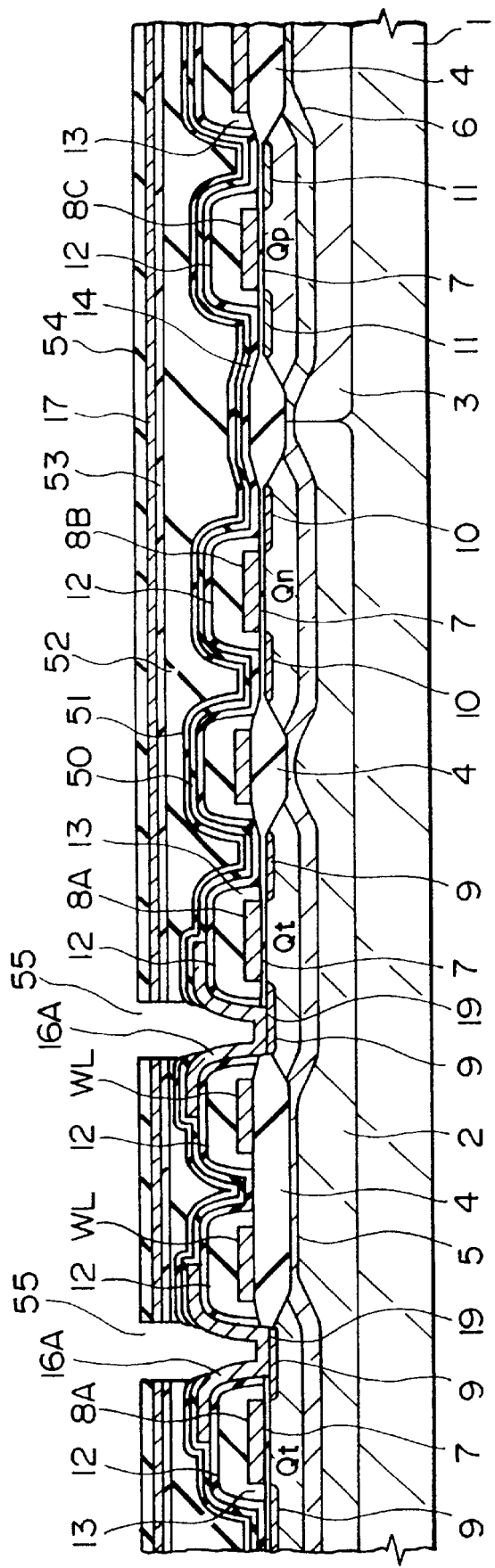
FIG. 10 is a diagram for explaining the fabrication steps following FIG. 9.
Figure 11:
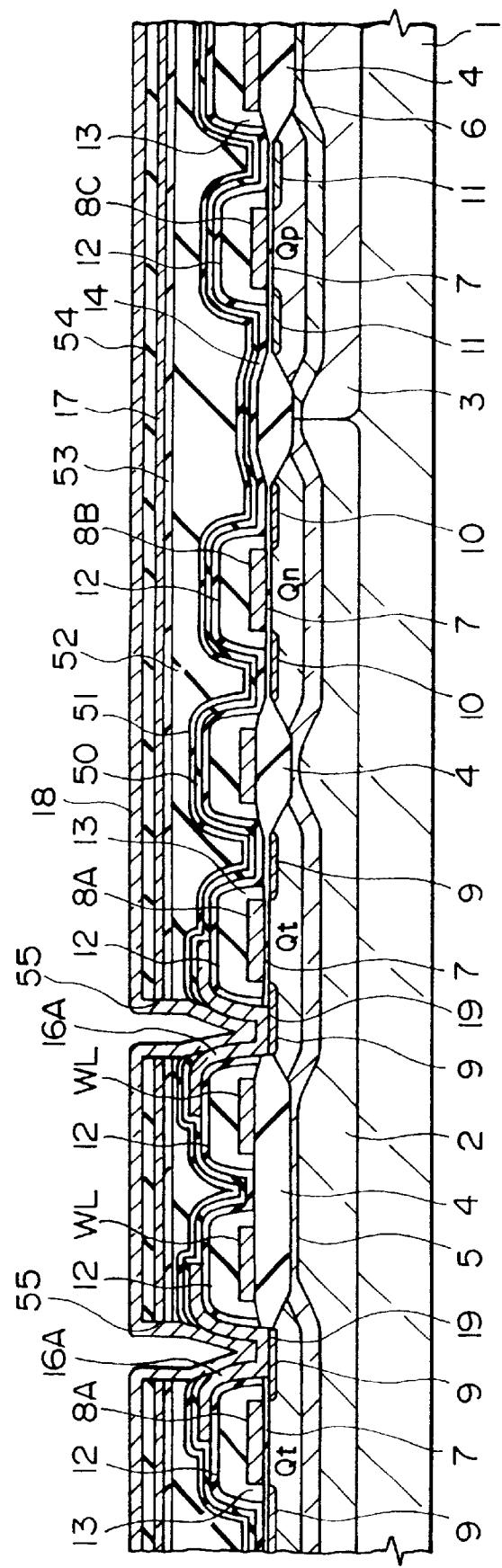
FIG. 11 is a diagram for explaining the fabrication steps following FIG. 10.

As shown in FIG. 10, a contact hole 55 reaching the fin 16A is formed in a silicon oxide film 54, the polycrystal silicon film 17, the silicon oxide film 53, the BPSG film 52, the silicon oxide film 51 and the silicon nitride film 50 by etching with a photoresist as a mask. After that, as shown in FIG. 11, the fourth layer of the polycrystal silicon film 18 is deposited by the CVD process in the contact hole 55 and on the silicon oxide film 54. The polycrystal silicon film 18 is doped with n-type impurities (phosphorus).

Figure 12:
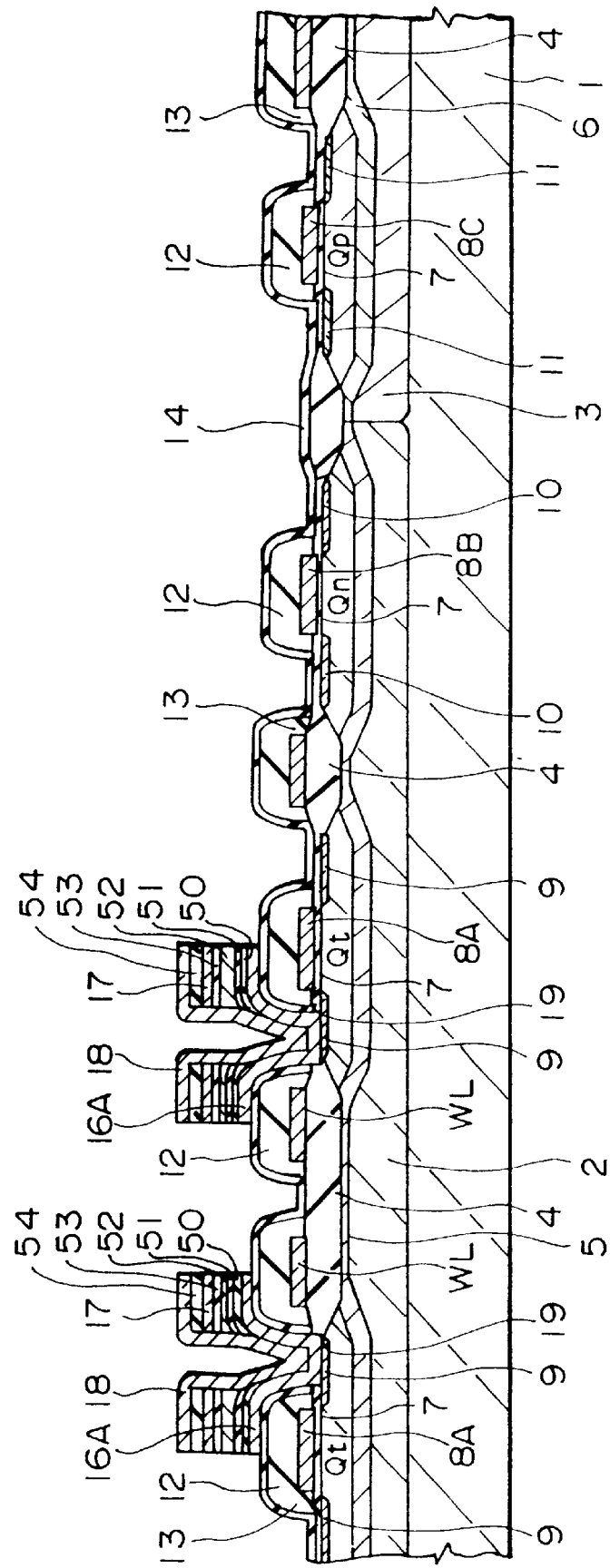
FIG. 12 is a diagram for explaining the fabrication steps following FIG. 11.

Then, as shown in FIG. 12, the fourth layer of the polycrystal silicon film 18, the silicon oxide film 54, the third layer of the polycrystal silicon film 17, the silicon oxide film 53, the BPSG film 52, the silicon oxide film 51 and the silicon nitride film 50 are sequentially patterned by etching with a photoresist as a mask.

Figure 13:
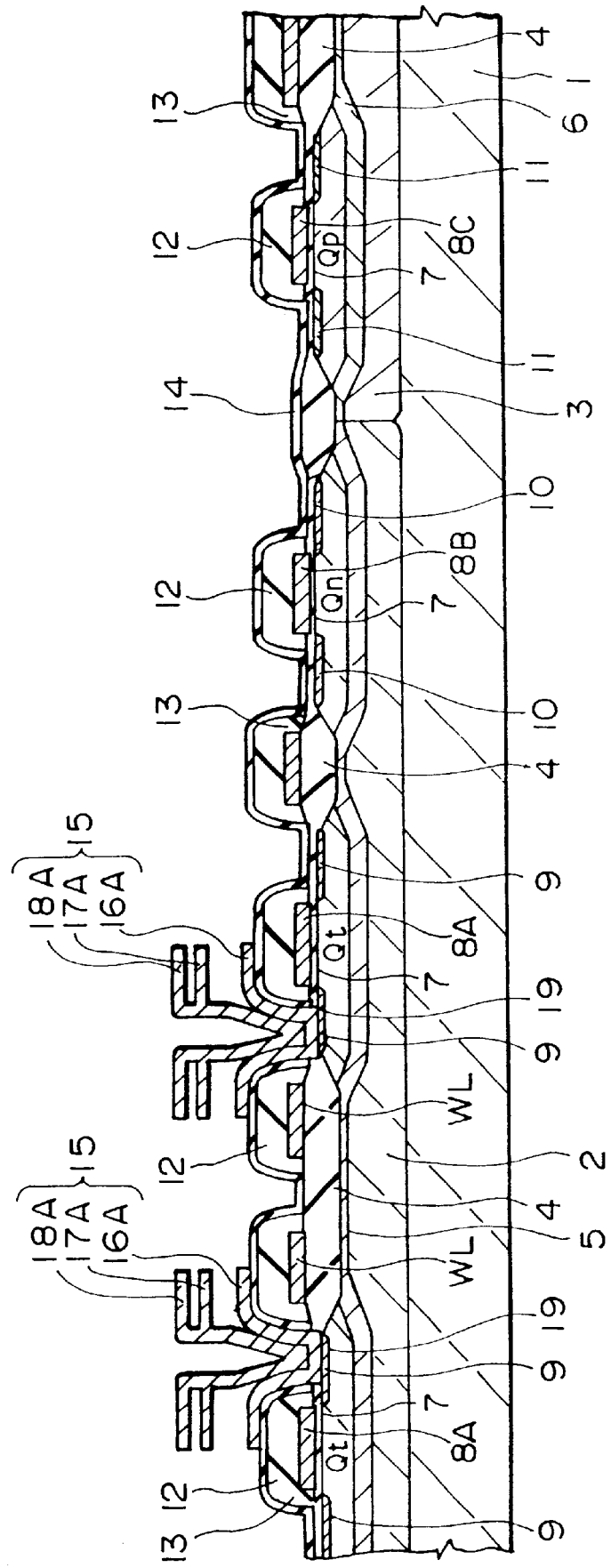
FIG. 13 is a diagram for explaining the fabrication steps following FIG. 12.

As shown in FIG. 13, the silicon oxide film 54 remaining between the fourth layer of the polycrystal silicon film 18 and the third layer of the polycrystal silicon film 17, and the silicon oxide film 53, the BPSG film 52, the silicon oxide film 51 and the silicon nitride film 50 remaining between the third layer of the polycrystal silicon film 17 and the fin 16A are removed by wet etching, thereby forming the storage electrode 15 composed of three layers of fins 16A, 17A, 18A.

Figure 14:
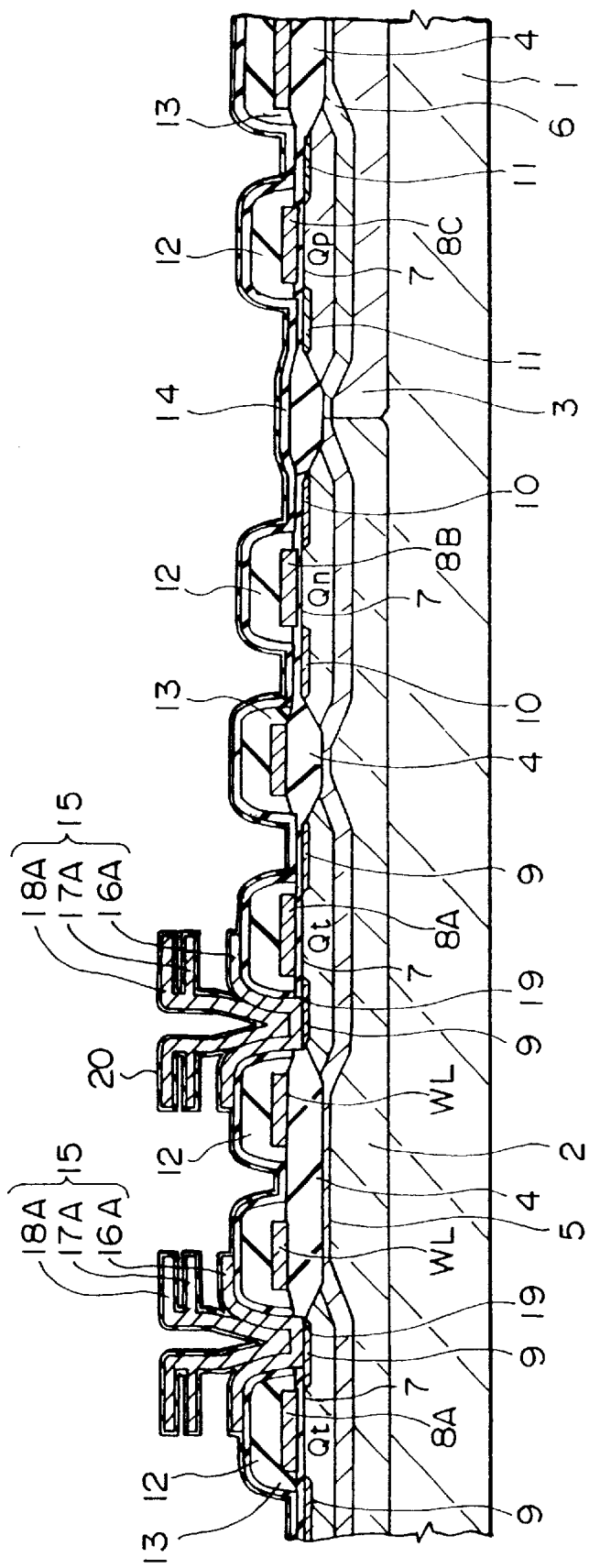
FIG. 14 is a diagram for explaining the fabrication steps following FIG. 13.
Figure 15:
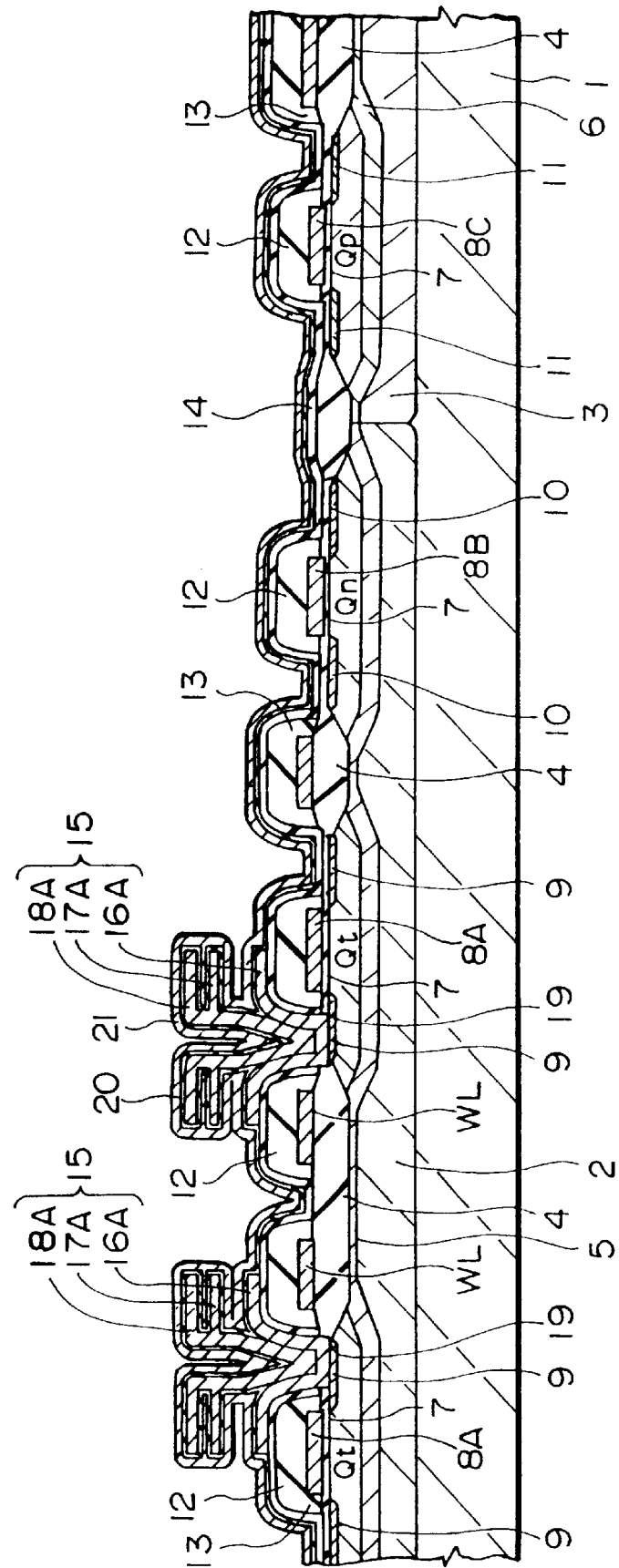
FIG. 15 is a diagram for explaining the fabrication steps following FIG. 14.

Then, as shown in FIG. 14, the capacitive insulating film 20 of silicon nitride is deposited by the CVD process over the entire surface of the semiconductor substrate 1. After that, as shown in FIG. 15, the fifth layer of the polycrystal silicon film 21 is formed by the CVD process on the capacitive insulating film 20. The polycrystal silicon film 21 is doped with n-type impurities (phosphorus).

Figure 16:
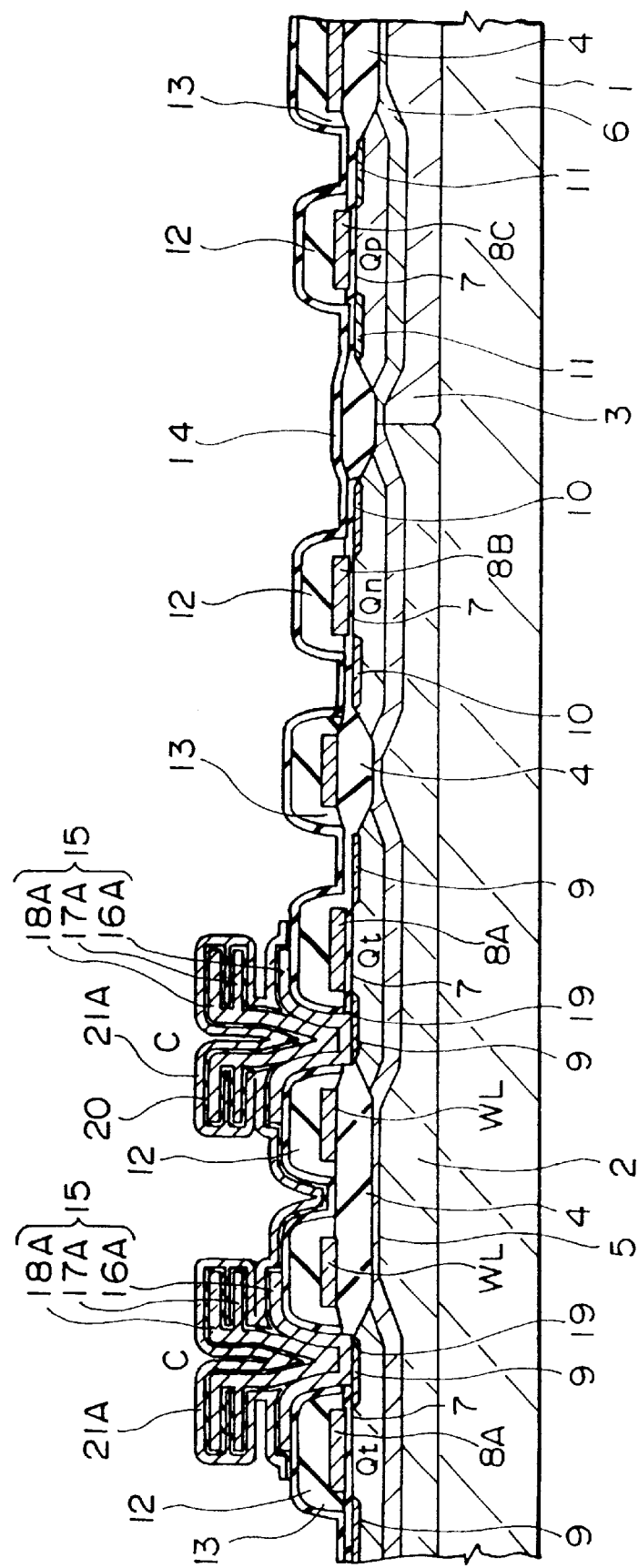
FIG. 16 is a diagram for explaining the fabrication steps following FIG. 15.

As shown in FIG. 16, the fifth layer of the polycrystal silicon film 21 is patterned by etching with a photoresist as a mask to form the plate electrode 21A, after which the capacitive insulating film 20 is patterned, thereby forming the information storage capacitor C including the storage electrode 15, the capacitive insulating film 20 and the plate electrode 21A.

Figure 17:
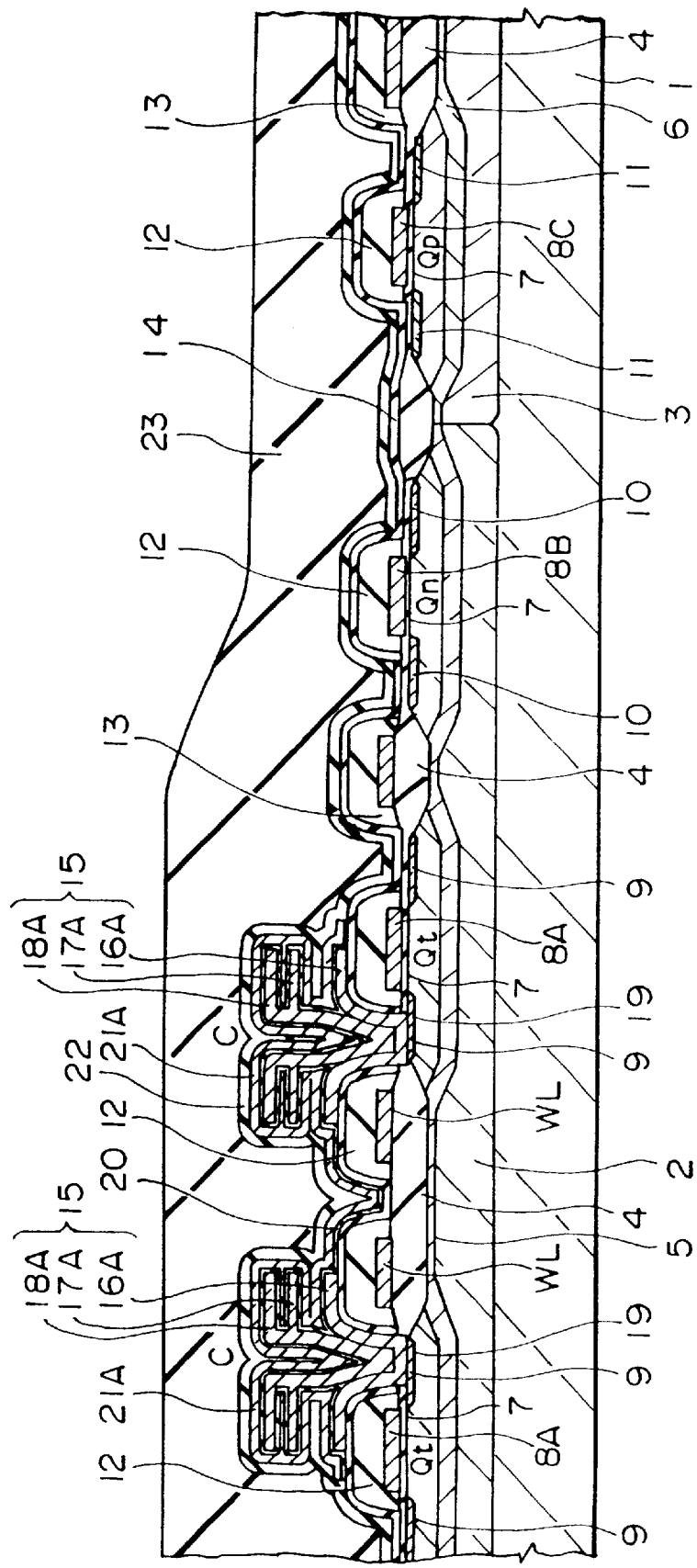
FIG. 17 is a diagram for explaining the fabrication steps following FIG. 16.

Next, as shown in FIG. 17, the silicon oxide film 22 and the BPSG film 23 are sequentially deposited by the CVD process over the entire surface of the semiconductor substrate 1, after which the semiconductor substrate 1 is annealed to reflow the surface of the BPSG film 23. In the process, the height of the memory array is increased by a size substantially equivalent to the height of the information storage capacitor C as compared with the height of the peripheral circuit.

Figure 18:
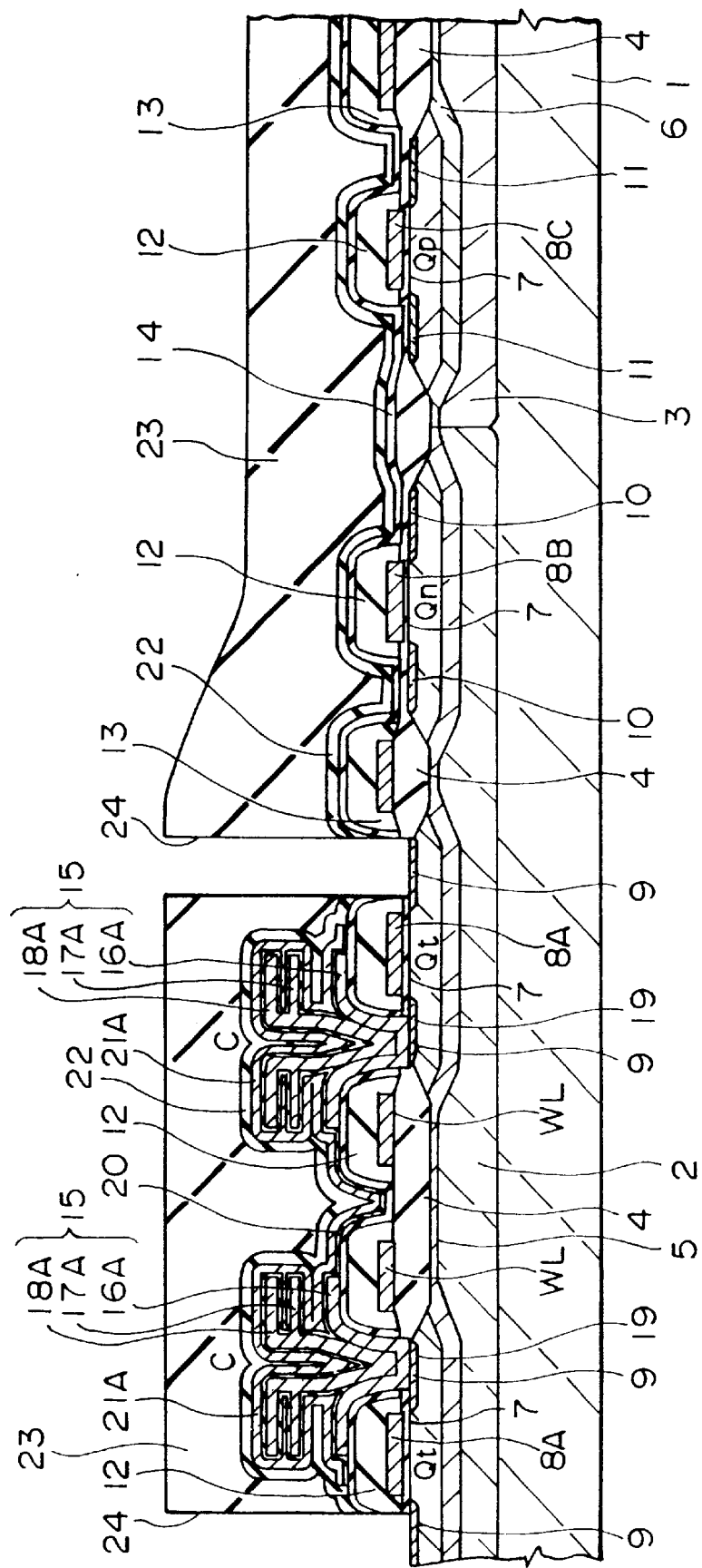
FIG. 18 is a diagram for explaining the fabrication steps following FIG. 17.

Then, as shown in FIG. 18, the contact hole 24 reaching the other n-type semiconductor region 9 of the memory cell-selecting MISFET Qt is formed in the BPSG film 23, the silicon oxide films 22, 14 and the gate oxide film 7 by etching with a photoresist as a mask. The diameter of this contact hole is about 0.4 to 0.6 $\mu$m and the depth thereof is about 2 $\mu$m.

Figure 19:
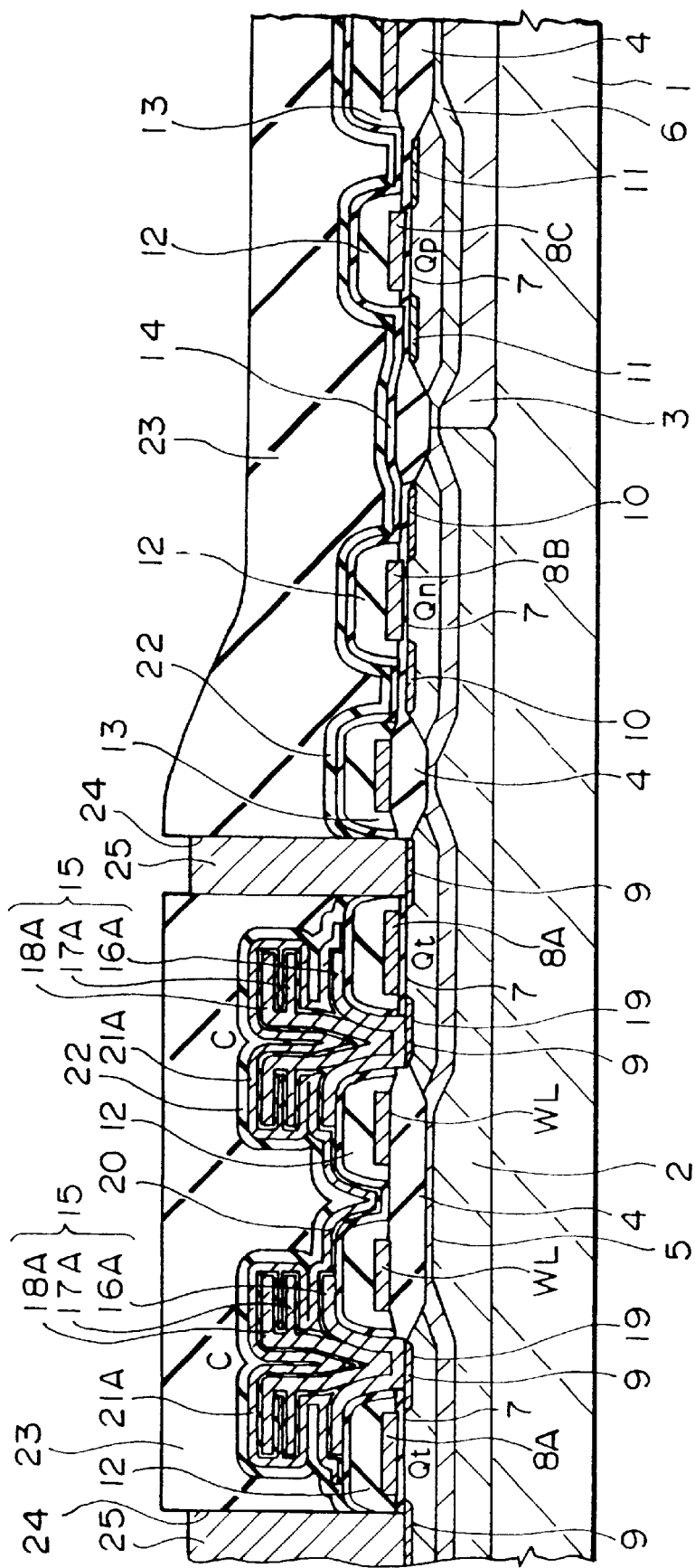
FIG. 19 is a diagram for explaining the fabrication steps following FIG. 18.

Next, as shown in FIG. 19, the polycrystalline silicon plug 25 is filled in the contact hole 24. The polycrystalline silicon plug 25 is filled in such a manner that a polycrystal silicon film is deposited by the CVD process on the BPSG film 23, and then the polycrystal silicon film is removed from the BPSG film 23 by etch back. In the process, in order to prevent the polycrystal silicon from being left on the BPSG film 23, a sufficient over-etching is performed. The surface height of the polycrystalline silicon plug 25, therefore, is somewhat lower than the upper end of the contact hole 24.

Figure 20:
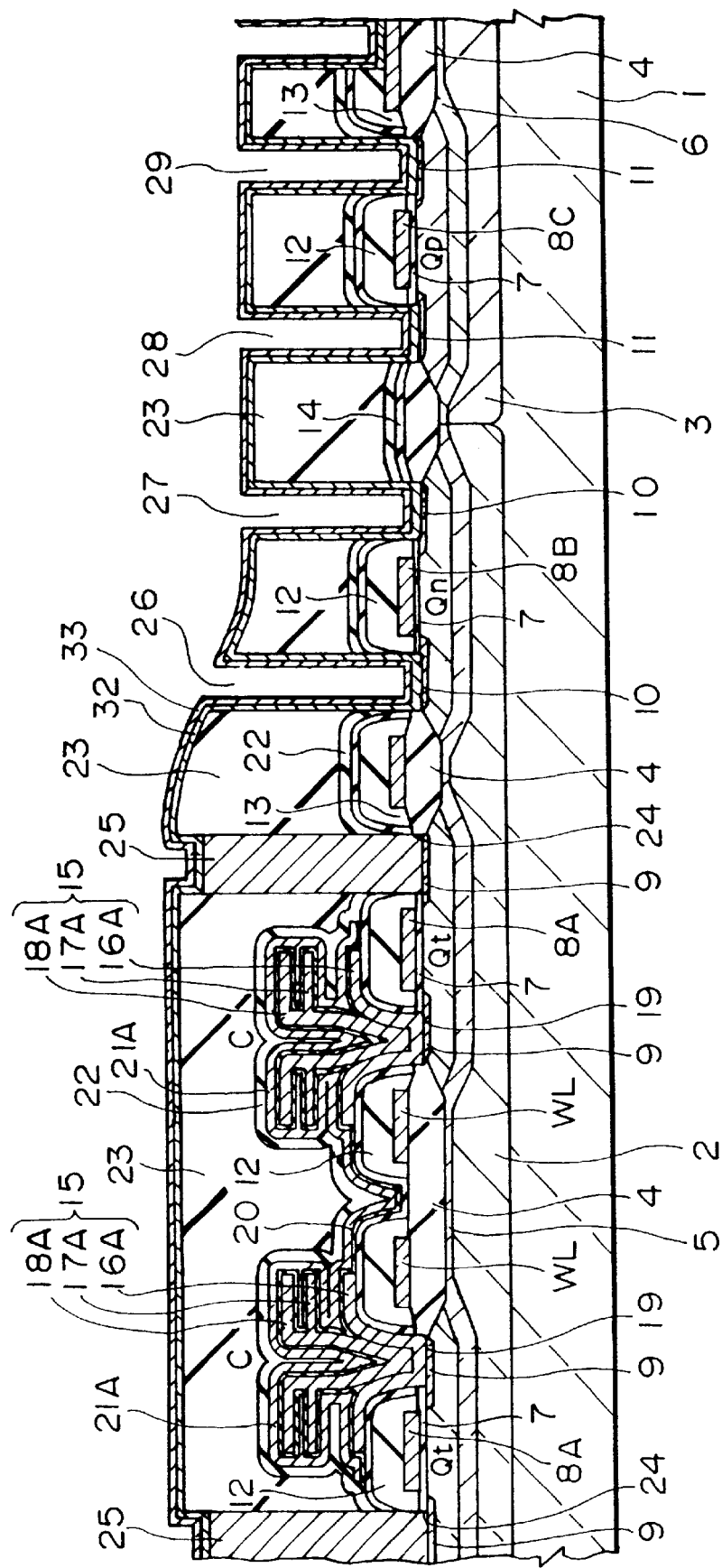
FIG. 20 is a diagram for explaining the fabrication steps following FIG. 19.

Then, as shown in FIG. 20, with a photoresist as a mask, the BPSG film 23, the silicon oxide films 22, 14 and the gate oxide film 7 are formed by etching with the contact holes 26, 27 having a diameter of about 0.5 μm reaching the n-type semiconductor region 10 of the n-channel MISFET Qn of the peripheral circuit and the contact holes 28, 29 having a diameter of about 0.5 μm reaching the p-type semiconductor region 11 of the p-channel MISFET Qp. After that, the Ti film 32 having a thickness of about 35 nm and the TiN film 33 having a thickness of about 70 nm are deposited sequentially by sputtering on the BPSG film 23.

The Ti film 32 and the TiN film 33 are deposited continuously in an inert gas environment of nitrogen or the like in order to prevent oxidization of the surface of the Ti film 32. Also, in order that the Ti film 32 may be sufficiently deposited in the contact holes 26 to 29 of the peripheral circuit higher in aspect ratio than the contact hole 24 filled with the polycrystalline silicon plug 25, such a method is used as the collimator sputtering process in which a honeycombed plate called a collimator is arranged between a target and the wafer or the low-pressure/long-distance sputtering process in which a film is formed under a low gas pressure with the distance widened between the target and the wafer.

Figure 21:
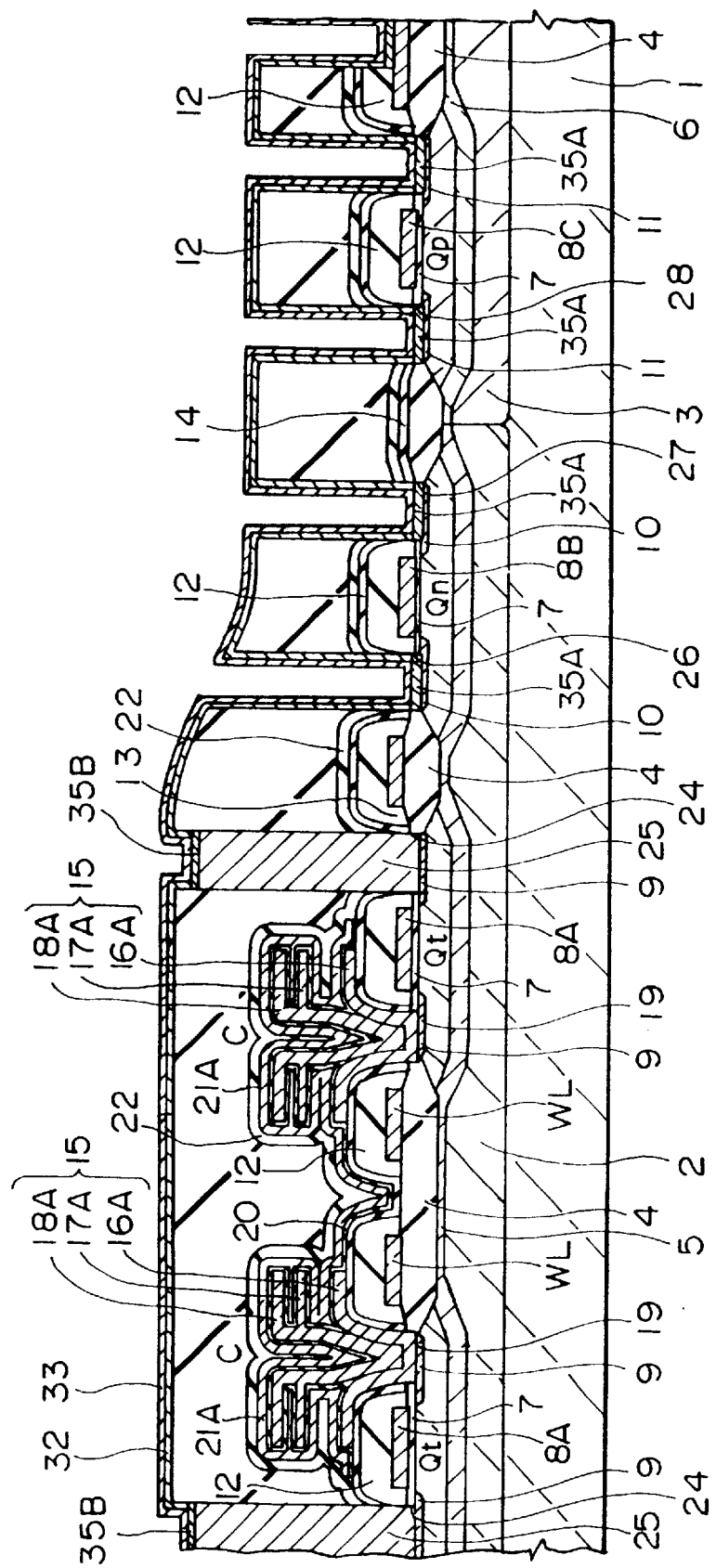
FIG. 21 is a diagram for explaining the fabrication steps following FIG. 20.

Then, as shown in FIG. 21, the semiconductor substrate 1 is annealed for about ten minutes at 650° C. to form a Ti silicide layer 35A on the bottoms of the contact holes 26 to 29 of the peripheral circuit, and also to form a Ti silicide layer 35B on the surface of the polycrystalline silicon plug 25 in the contact hole 24 for bit line BL.

The contact hole 24 for the bit line BL, which is required to be electrically connected, must be formed in a manner not separable.

Figure 25:
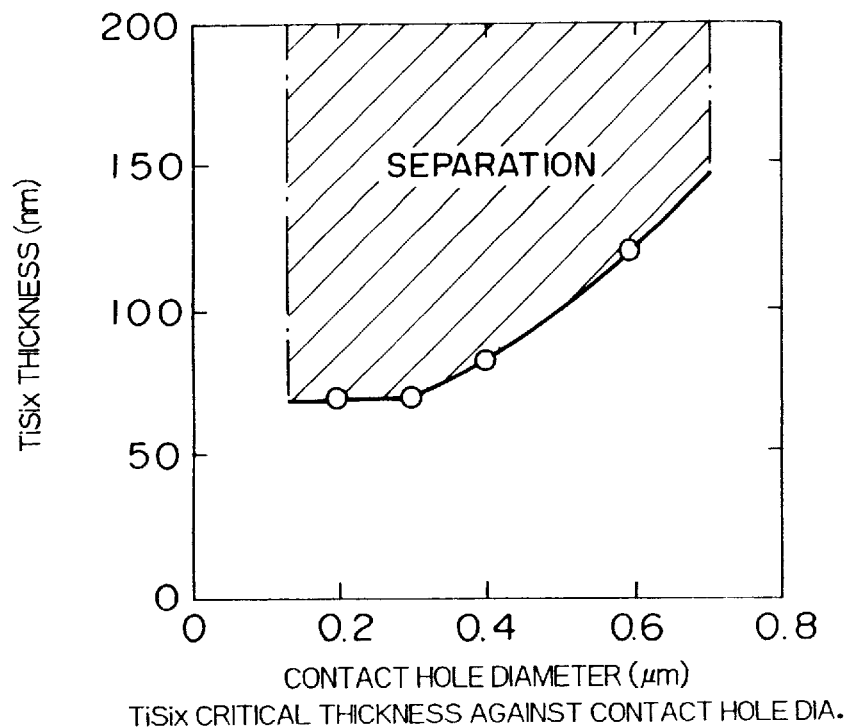
FIG. 25 is a graph showing the relation between the thickness of the Ti silicide layer and the separation at the interface of the polycrystalline silicon plug.

As shown in FIG. 25, in order to prevent separation of the interface between the polycrystalline silicon plug 25 and the Ti silicide layer 35B, the thickness of the Ti silicide layer 35B is set to about 120 nm or less when the diameter of the contact hole 24 is about 0.6 μm, set to about 84 nm or less when the diameter of the contact hole 24 is about 0.4 μm, and set to about 72 nm or less when the diameter of the contact hole 24 is about 0.3 to 0.2 μm.

Figure 26:
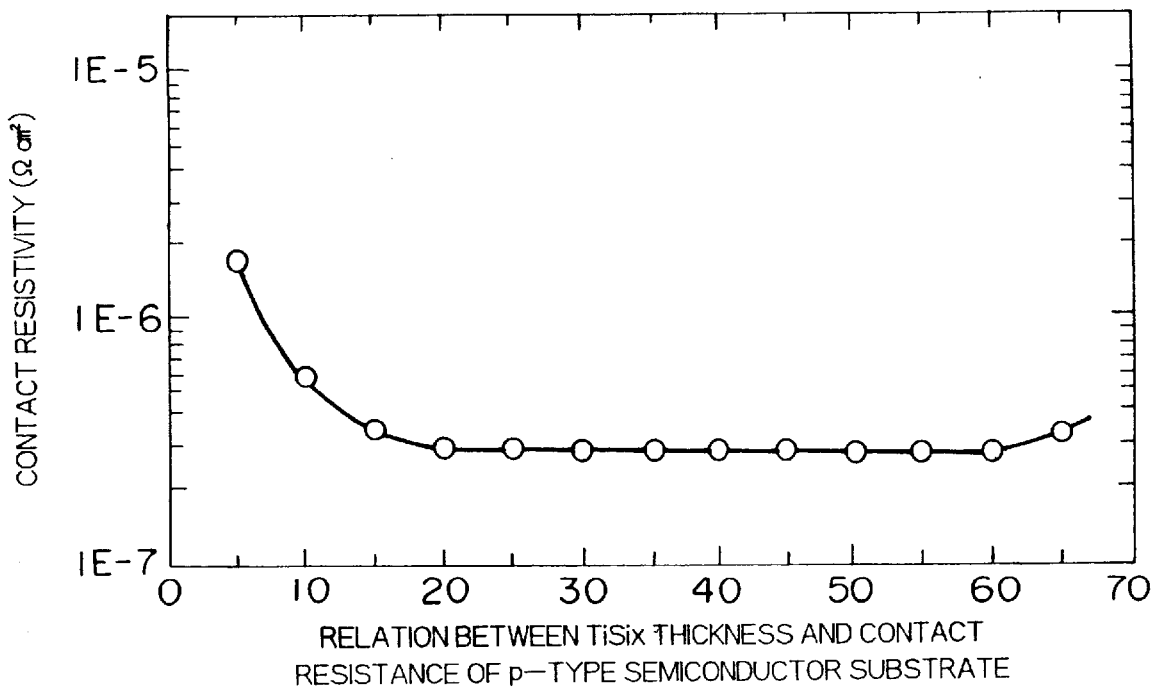
FIG. 26 is a graph showing the relation between the thickness of the Ti silicide layer formed on the surface of the p-type semiconductor region and contact resistance.

The thickness of the Ti silicide film 35A is set to about 10 nm or more, as shown in FIG. 26, in order for the contact resistance of the wiring 31 connected to the p-type semiconductor region 11 of the p-channel MISFET Qp of the peripheral circuit to be about $6 \times 10^{-7}$ $\Omega cm^2$ or less allowable for an ordinary DRAM. Also, in the case of a DRAM requiring high operating speed and a device with a DRAM and a high-speed logic LSI formed on the same chip, the thickness of the Ti silicide layer 35A is desirably about 20 nm or more (contact resistance=$2 \times 10^{-7}$ $\Omega cm^2$ or less). The contact resistance of the Ti silicide layer 35A formed on the surface of the n-type semiconductor region 10 of the n-channel MISFET and the Ti silicide layer 35B formed on the surface of the polycrystalline silicon plug 25 doped with n-type impurities is about $5 \times 10^{-8}$ $\Omega cm^2$ regardless of the film thickness.

In this invention, the word "about" attached to the figures indicate that an error of Max±10% is present as working tolerance.

Figure 22:
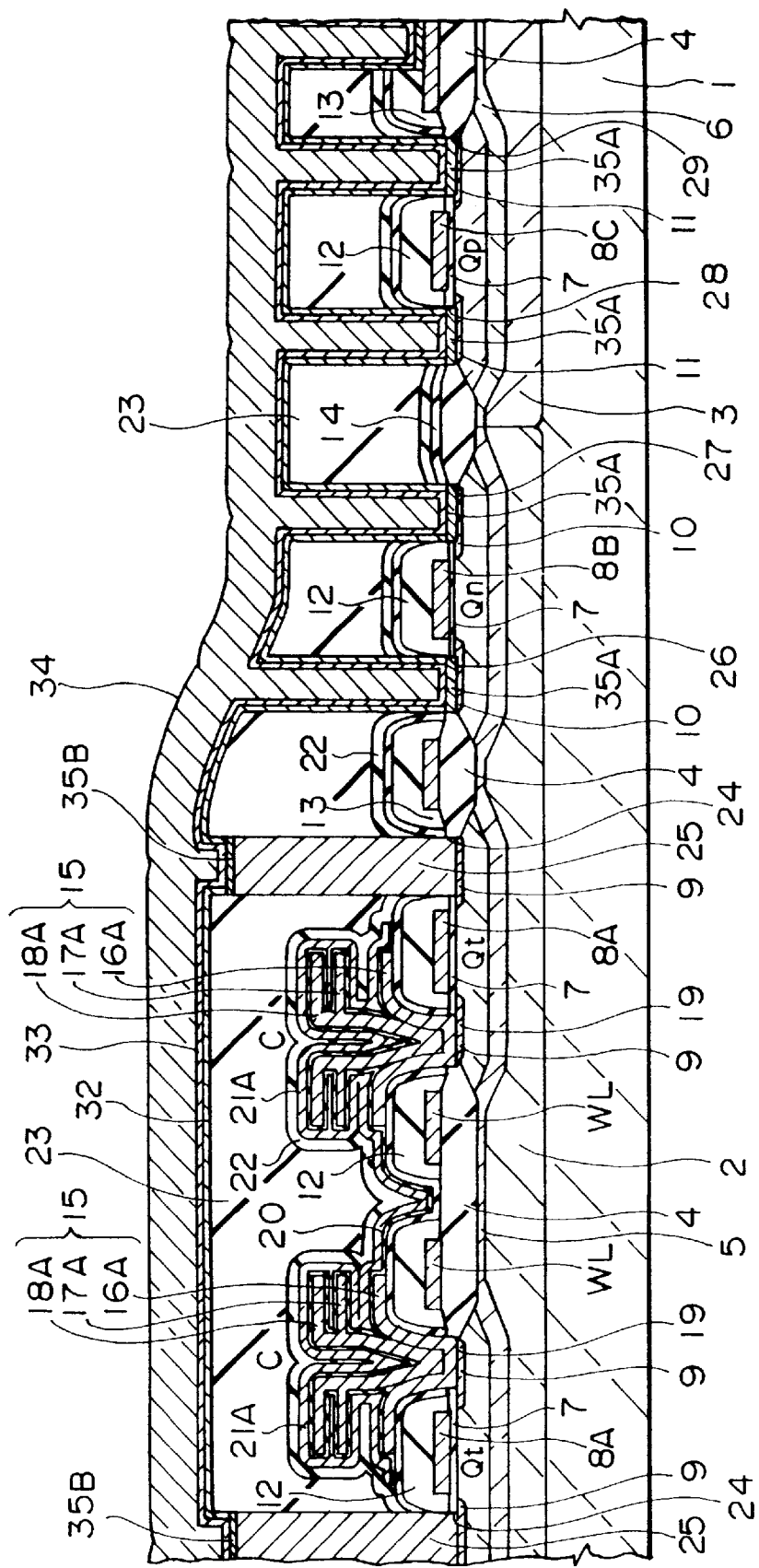
FIG. 22 is a diagram for explaining the fabrication steps following FIG. 21.

Then, as shown in FIG. 22, a W film 34 is deposited by the CVD process over the entire surface of the semiconductor substrate 1. This W film 34 may be configured of a double film including a W film (lower layer) deposited by CVD and a W film (upper layer) deposited by sputtering.

Figure 23:
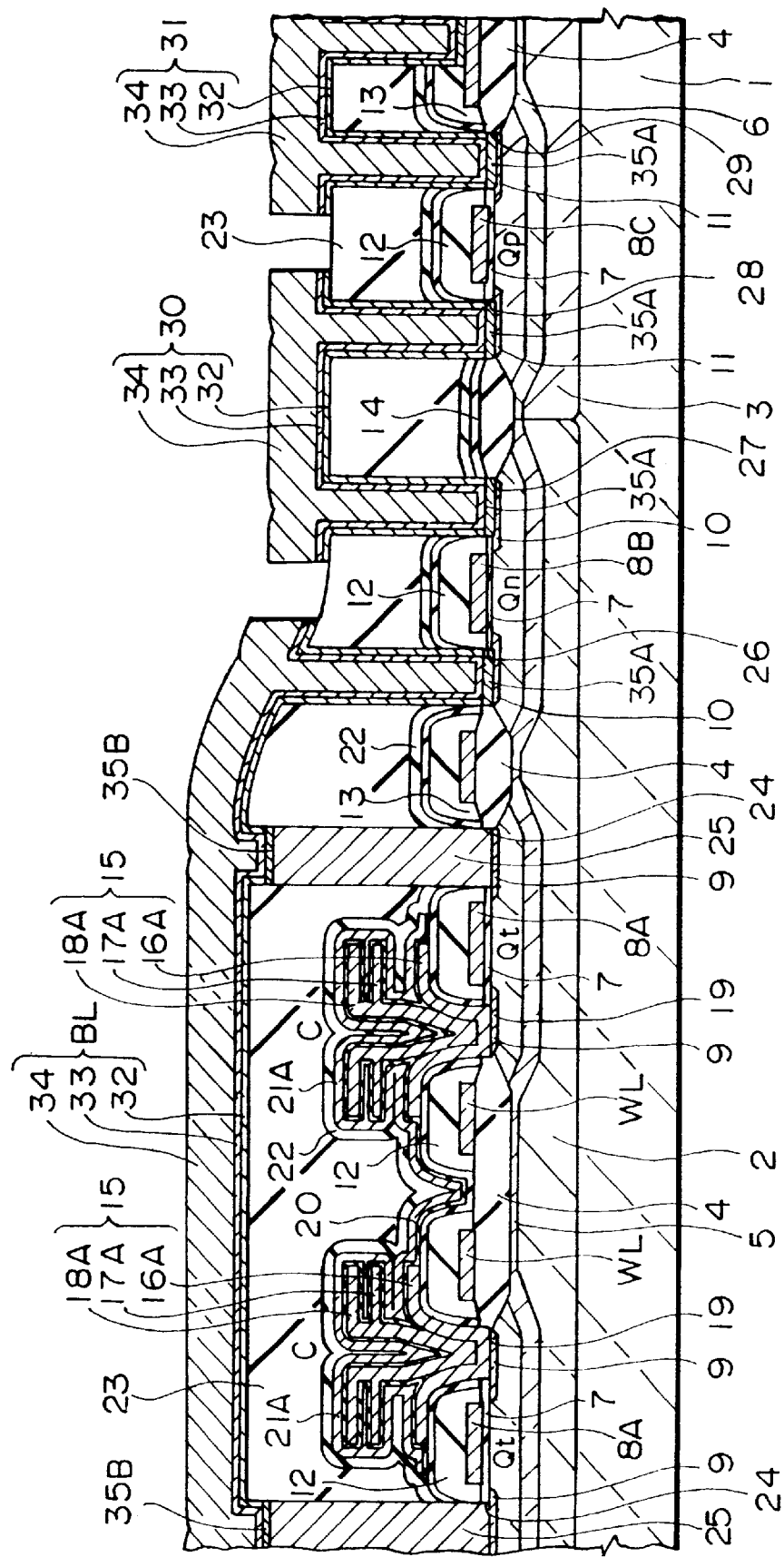
FIG. 23 is a diagram for explaining the fabrication steps following FIG. 22.

Next, as shown in FIG. 23, the bit line BL and the wirings 30, 31 are formed by patterning the Ti film 32, the TiN film 33 and the W film 34 on the BPSG film 23 by etching with a photoresist as a mask.

Figure 24:
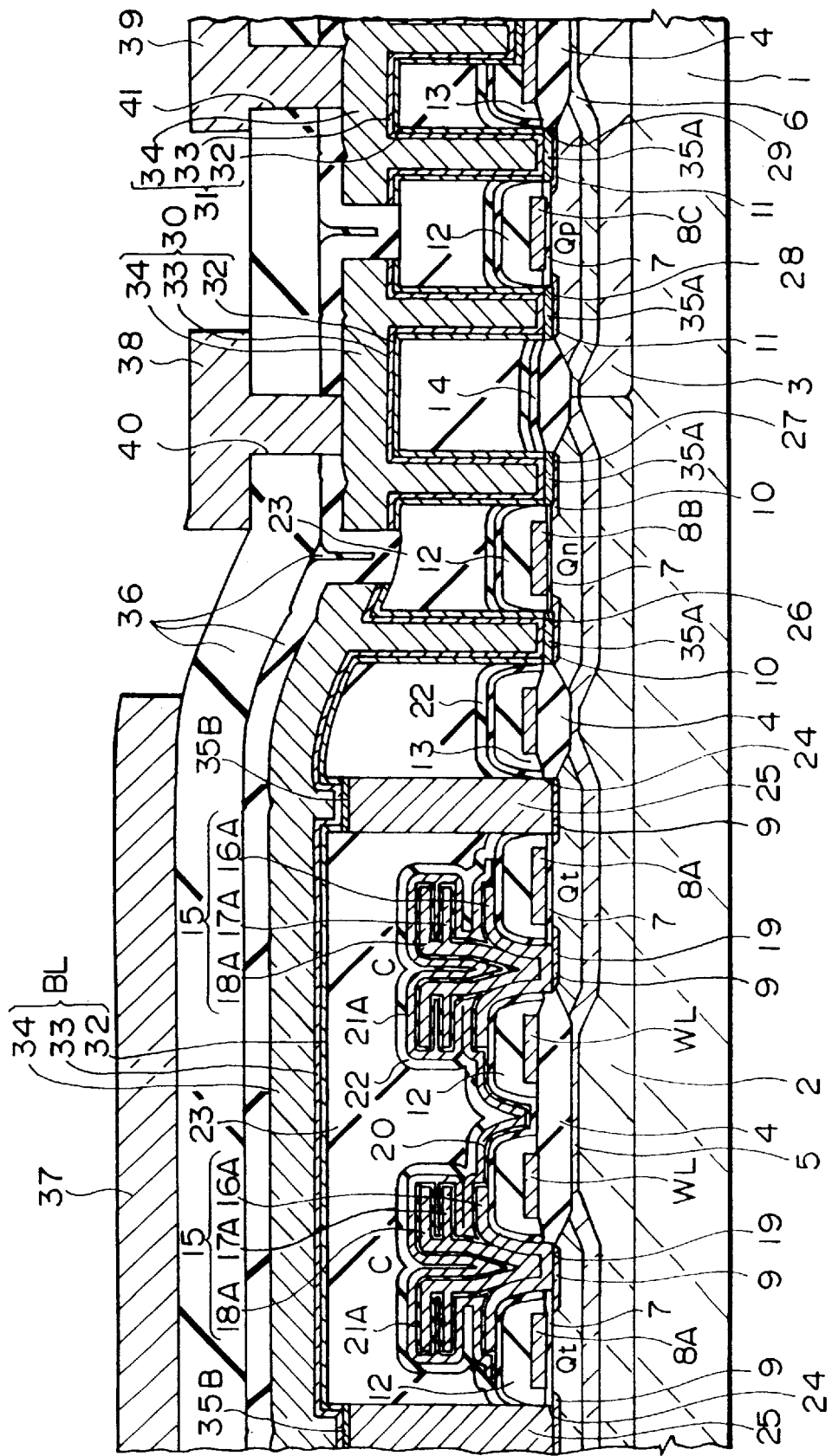
FIG. 24 is a diagram for explaining the fabrication steps following FIG. 23.

As shown in FIG. 24, a first layer of the layer insulating film 36 is deposited above the bit line BL and the wirings 30, 31, and then the layer insulating film 36 is formed with contact holes 40, 41, followed by patterning the metal film (such as an Al alloy film) deposited on the layer insulating film 36 thereby to form the second layer of wirings 37, 38, 39.

After that, the second layer of the layer insulating film 42 is deposited above the second layer of wirings 37, 38, 39. The metal film (such as an Al alloy film) deposited on the layer insulating film 42 is patterned thereby to form the third layer of wirings 43, 44, 45. In this way, the DRAM according to the invention shown in FIG. 1 is substantially completed.

The invention developed by the present inventors was described above specifically with reference to an embodiment. The present invention is not limited to the above-mentioned embodiment, however, and can of course be modified in various ways without departing from the scope and spirit of the invention.

According to the above-mentioned embodiment, explanation was made about a DRAM having a memory cell of stacked capacitor structure. The present invention, however, is applicable to semiconductor integrated circuit devices in general, in which the main surface of a semiconductor substrate is formed with a relatively high first region and a relatively low second region, a polycrystalline silicon plug of the same conductivity type as the semiconductor region of the first region is formed in a first contact hole connecting a first wiring and the first semiconductor region of the first region, and the first layer of the wiring and the second wiring connected to the second semiconductor region of the second region through the second contact hole are composed of a W—TiN—Ti film in the same wiring layer.

Now, explanation will be made about various embodiments of a contact structure between a wiring metal section and semiconductor regions of a semiconductor device and a method of fabrication thereof according to the present invention.

Figure 27:
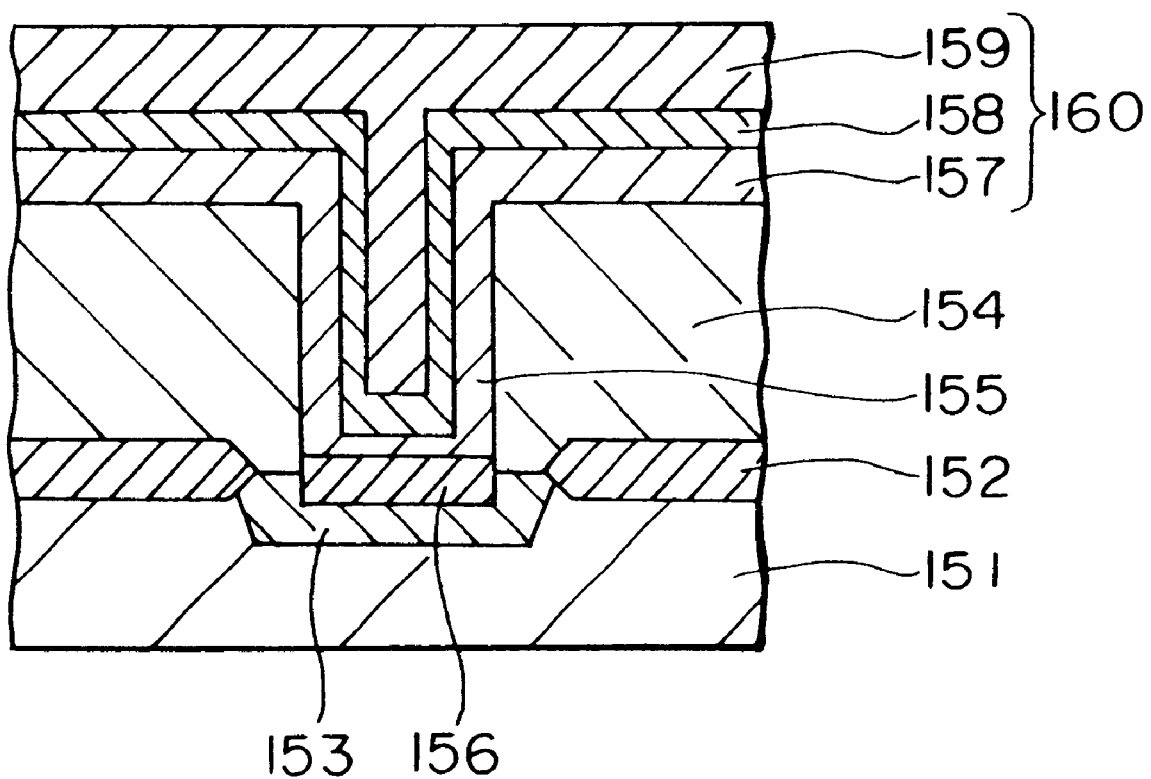
FIG. 27 is a diagram showing the contact structure of a semiconductor device according to an embodiment of the invention.

A contact structure of a semiconductor device according to an embodiment of the invention includes, as shown in FIG. 27, a silicon substrate 151 and an insulating film 154 formed on the surface of the silicon substrate 151, in which a device forming region 153 and an electrical wiring metal 160 formed on the silicon substrate 151 in the contact hole, formed in the insulating film, are connected through a titanium silicide film 156.

This contact structure of the semiconductor device is fabricated by the method shown in the sectional views of FIGS. 28A to 28D.

Figure 28A:
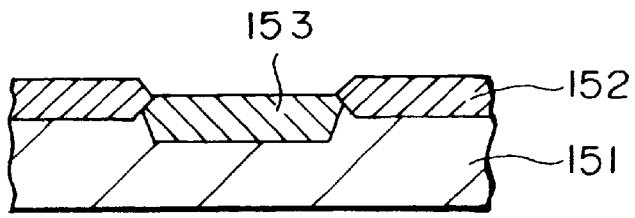
FIGS. 28A to 28D are diagrams showing the steps of fabricating the semiconductor device shown in FIG. 27.

(1) The device isolation region 152 and the device forming region 153 are formed on the silicon substrate 151 (FIG. 28A).

Figure 28B:
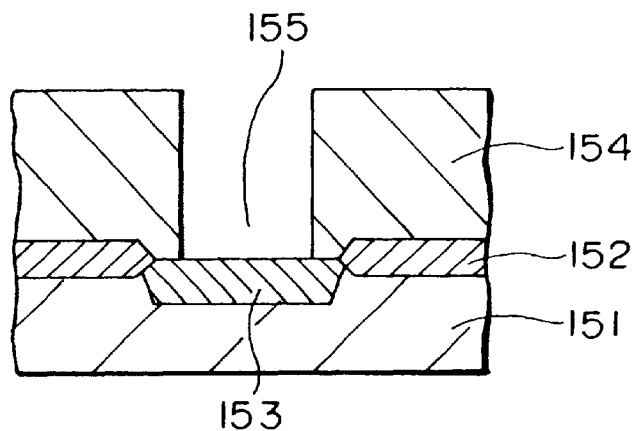

(2) After the device forming region 153 is formed, an insulating film 154 is formed on the upper surface of the silicon substrate 151. Then, the insulating film 154 is formed with a contact hole 155 (FIG. 28B).

Figure 28C:
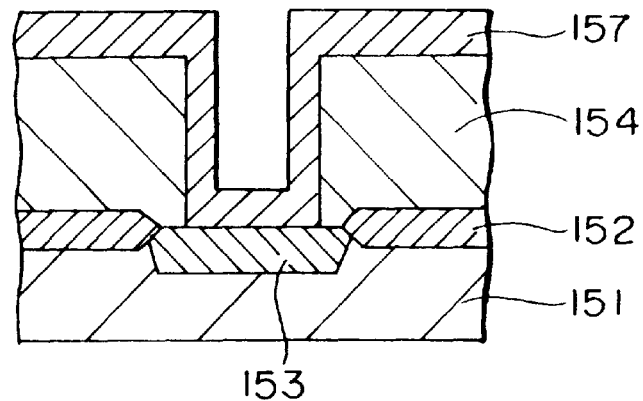

(3) A titanium film 157 is deposited to the thickness of 8 nm or more in such a manner as to contact the upper surface of the device forming region 153 on the bottom of the contact hole 155 and on each side wall of the insulating film 154 in the contact hole 155 and on the upper surface of the insulating film 154 (FIG. 28C).

Figure 28D:
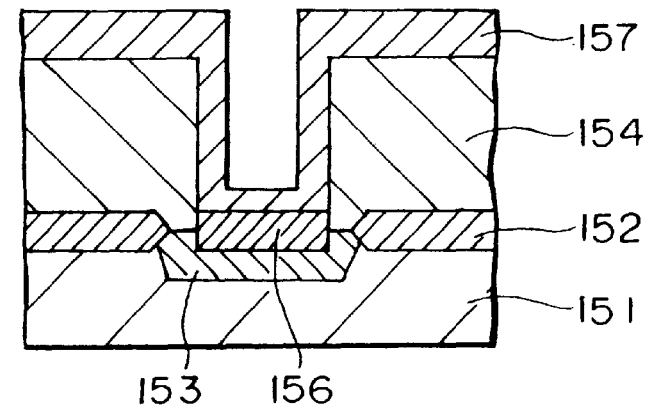

(4) The silicon substrate 151 deposited with a titanium film 157 to the thickness of 8 nm or more is heat-treated thereby to cause silicide reaction between the titanium film 157 and the silicon of the device forming region 153, thereby forming a titanium silicide film 156 in the interface (FIG. 28D).

In the process, the heat treatment conditions are set in such a manner that the titanium film 157 causes silicide reaction with a thickness of 4 to 48 nm, or preferably 8 to 34 nm. The thickness of 4 to 48 nm of the titanium film 157 corresponds to the thickness of 10 to 120 nm of the silicide layer, and the thickness of 8 to 34 nm thereof corresponds to the thickness of 20 to 84 nm of the silicide layer.

If the silicidation is to occur, the heat treatment temperature is required to be at least 650° C. or, more preferably, at least 800° C. or more, for the reason described later. Also, this temperature is desirably 1000° C. or less in order to prevent diffusion of impurities introduced into the silicon.

The silicidation of the titanium film 157 with the thickness of 8 to 34 nm leads to the titanium silicide film 156 having the thickness of 20 to 84 nm. This is by reason of the fact that silicon thicker than titanium by a factor of 2.3 is theoretically consumed thereby to form a titanium silicide film thicker by a factor of about 2.5.

Now, explanation will be made about the operation and effect of the contact structure of a semiconductor device according to this embodiment with reference to FIGS. 29 to 32.

Figure 29:
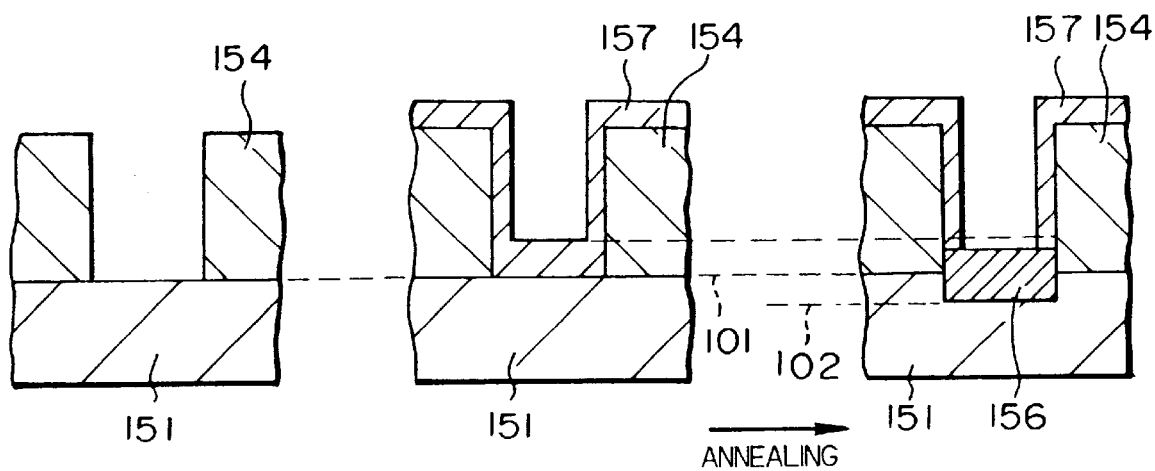
FIG. 29 is a diagram showing positions of interfaces of titanium silicide and silicon generated due to silicide reaction.

FIG. 29 is a diagram schematically showing positions of interfaces of titanium silicide and silicon generated due to the silicidation. As shown in FIG. 29, the titanium film 157 is deposited on the silicon substrate 151, and the silicon substrate 151 is caused to react with the titanium film 157 by heat treatment to form the titanium silicide film 156. In this case, theoretically, silicon thicker than the titanium film by a factor of about 2.3 is consumed and the titanium silicide about 2.5 times thicker than the titanium film is formed. Due to the volume change (volume reduction) and density change caused by the silicidation between the silicon substrate 151 and the titanium film 157, therefore, the position of the interface between the silicon substrate and the titanium silicide film formed is lowered to silicon side by a factor of 2.3 (in the thickness ratio to the titanium consumed by reaction) than the position of the interface 101 between the insulating film 154 and the silicon substrate 151. In the case where the titanium silicide is formed to the thickness of 20 to 84 nm, for example, the distance between interfaces 101 and 102 is 18 to 78 nm.

In the case where the titanium silicide is formed to the thickness of 10 to 120 nm, for example, the distance between the interfaces 101 and 102 is 9 to 110 nm.

The volume change (volume reduction) and the density change due to the silicidation also generates a stress in the titanium silicide film.

Figure 30:
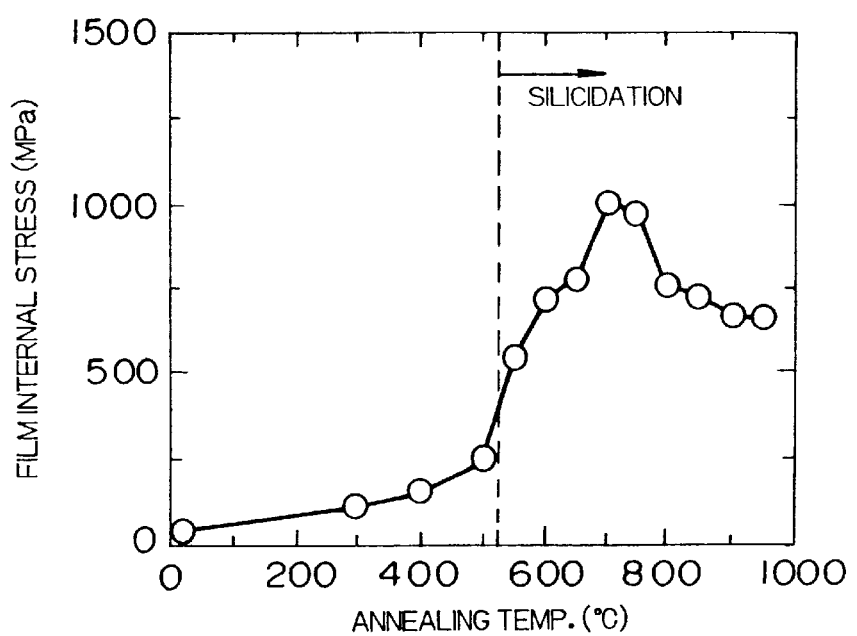
FIG. 30 is a graph showing the stress caused in the film by the silicidation.

FIG. 30 is a graph showing the stress generated in the film due to the silicidation. The stress value is a measurement obtained in an experiment.

As understood from FIG. 30, the internal stress of the film suddenly increases at a heat treatment temperature of 550° C. or higher. This is due to the silicidation at 550° C. or higher and generation of a titanium silicide film. The generation of a tensile stress of 1000 MPa at maximum in the titanium silicide film is experimentally obvious.

Figure 31:
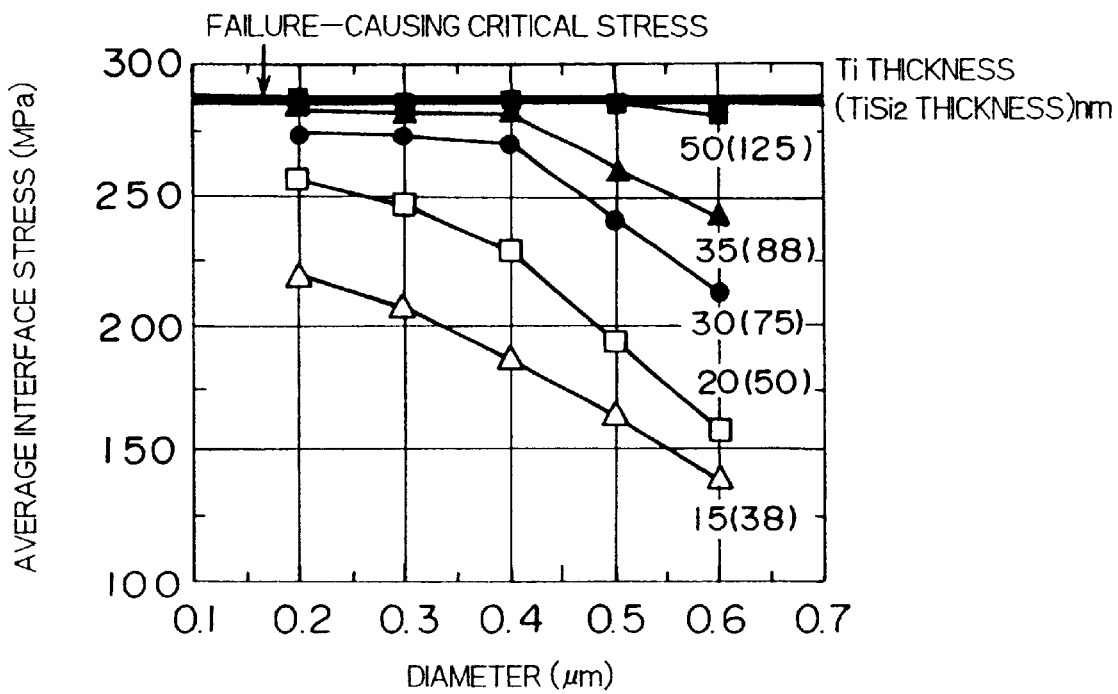
FIG. 31 is a graph showing the relation between the average stress generated in the interface between the silicon film and the titanium silicide film, the titanium film thickness and the contact hole diameter.

FIG. 31 shows the result of analyzing the average stress (shearing stress) generated in the interface between the titanium silicide and the silicon by the infinite element method taking the contact structure and the maximum stress 1000 MPa determined from FIG. 30 into consideration. As noted from FIG. 31, in the case where the hole diameter is constant, the average stress generated in the interface increases with the increase of the thickness of the titanium silicide film, while in the case where the thickness of the titanium silicide film is constant, the average stress generated in the interface increases with the decrease in the diameter of the contact hole.

Comparison between the analysis result and experimental data on defects thus obtained determines that the critical stress causing a breakdown is 280 MPa. In order to prevent separation of the titanium silicide film, it is indispensable to design the average stress generated in the interface not more than the critical breakdown stress value. Specifically, in the case where the thickness of the titanium silicide film is 84 nm or less, the average stress exerted in the interface can be maintained not more than the critical breakdown stress regardless of the diameter of the contact hole. In the case where the contact hole diameter is larger than 0.4 μm, on the other hand, the average stress generated in the interface can be reduced to not more than the critical breakdown stress value without reducing the titanium silicide film thickness to 84 nm or less. In the case where the contact hole diameter is 0.4 μm or less, however, the increase of the titanium silicide thickness to more than 84 nm may separate the titanium silicide film. With a contact hole having a diameter of 0.4 μm or less, therefore, it is necessary to keep the thickness of the titanium silicide film at 84 nm or less in order to prevent the separation of the titanium silicide film.

Figure 32:
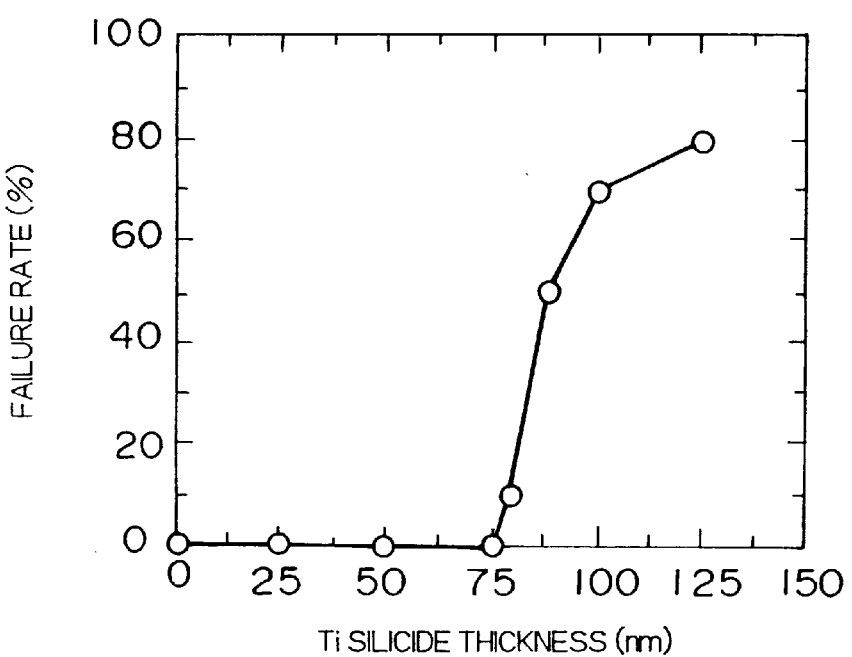
FIG. 32 is a graph showing the relation between the open failure rate (separation of titanium silicide film) and the thickness of the titanium silicide film for the contact hole diameter of 0.4 $\mu$m.
Figure 33:
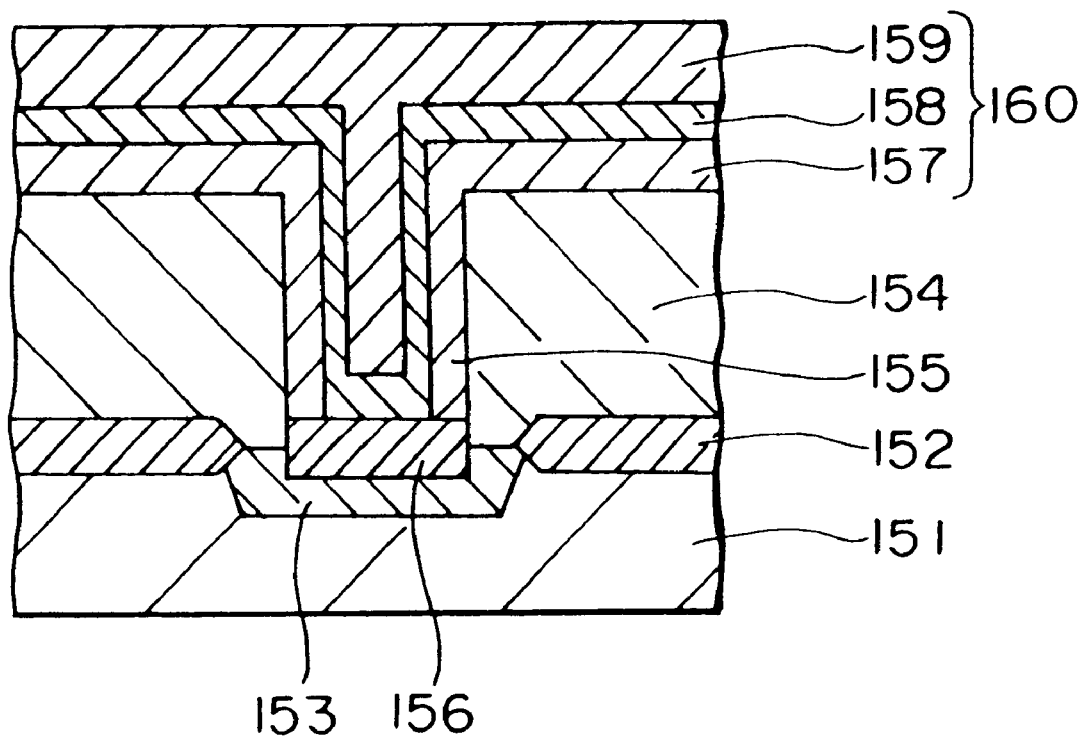
FIG. 33 is a diagram showing the contact structure of a semiconductor device according to another embodiment of the invention.

FIG. 32 shows the result of studying the relation between the breakdown defect rate (separation of the titanium silicide film) and the thickness of the titanium silicide film obtained on a test-produced contact hole having a diameter of 0.4 μm for verifying the above-mentioned facts. It is obvious that with the titanium silicide film thickness of up to 75 nm, no defect occurs. With the titanium silicide film thickness of over 84 nm, however, defects suddenly increase. This fact shows that in the case of forming the titanium silicide film 156 by the silicidation between the titanium film 7 and the silicon in the contact, the thickness of the titanium silicide film is required to be reduced to 84 nm or less, preferably 75 nm or less for preventing the breakdown defect of the titanium silicide film from occurring in the interface between the silicon and the titanium silicide film.

It is experimentally confirmed that the contact resistance increases for the thickness of 20 nm or less of the titanium silicide film. The thickness of the titanium silicide film, therefore, is required to be increased to 20 nm or more for the parts requiring a low resistance.

In other words, for a stable contact low in contact resistance and free of separation to be formed, the thickness of the titanium silicide film is required to be 20 to 84 nm.

According to this embodiment, as shown in FIG. 27, the titanium film 157 not used for the silicidation exists between the titanium nitride film and the titanium silicide film.

As described above, the interposition of the titanium film 157 between the titanium nitride film and the titanium silicide film reduces the internal stress of the titanium nitride film and increases the separation strength of the titanium nitride film more than when the titanium nitride film and the titanium silicide film are deposited one on the other directly.

In order for the titanium layer 157 to exist between the titanium nitride film and the titanium silicide film, it is necessary that the thickness of the titanium layer 157 is more than required for silicide reaction and that the temperature and time of heat treatment is appropriately controlled to secure the thickness of the titanium silicide film of 20 to 84 nm.

In the sectional view showing the contact structure of a semiconductor device according to the present embodiment shown in FIG. 27, the titanium silicide film 156 is formed in the interface between the electrical wiring metal film 160 and the device forming region 153 in the contact hole 155 on the bottom thereof. The upper surface of the titanium silicide film 156 is formed with the electrical wiring metal film 160 composed of a lamination of the titanium film 157, the titanium nitride film 158 and the tungsten film 159. Also, the upper surface of the insulating film 154 is deposited with the titanium film 157, the titanium nitride film 158 and the tungsten film 159.

The titanium film 157 is not necessarily present, but the titanium nitride film 158 may be formed in direct contact. Also, the structure is not limited to the titanium nitride film 158 and the tungsten film 159, but the electrical wiring metal film 160 may be composed of, in addition to titanium metal, titanium nitride or tungsten, such a material as an aluminum alloy, molybdenum silicide, tungsten silicide or a laminated structure of any combination of these materials. Further, other conductive films or insulating films may be employed with equal effect. The structure is not necessarily a lamination of different types of materials.

Now, a sectional view of a contact structure of a semiconductor device and a method of fabrication thereof according to another embodiment of the invention are shown in FIGS. 33, 34A to 34D.

Figure 34A:
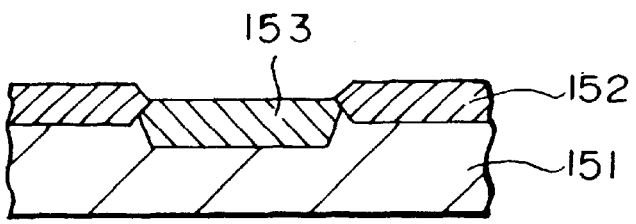
FIGS. 34A to 34D are diagrams showing the steps of fabricating the semiconductor device of FIG. 33.
Figure 34B:
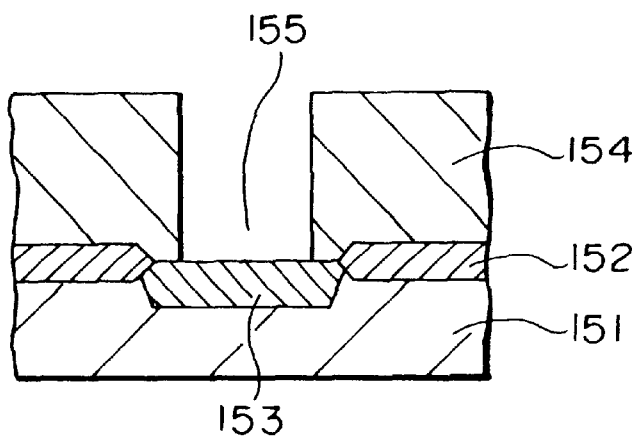

Specifically,
(1) The device isolation region 152 and the device forming region 153 are formed on the silicon substrate 151.
(2) After a device is formed on the device forming region 153, the insulating film 154 is formed on the upper surface of the device. Then, the contact hole 155 is formed in the insulating film 154 (FIG. 34B).
(3) The titanium film 157 is deposited to the thickness of 8 to 34 nm in a manner to contact the upper surface of the device forming region 153 on the bottom of the contact hole 155 and on each side wall of the insulating film in the contact hole 155.
(4) The silicon substrate 151 deposited with the titanium film 157 to the thickness of 8 to 34 nm is heat treated so that the silicidation is caused between the titanium film 157 and the silicon of the device forming region 153, thereby forming the titanium silicide film 156 in the interface.

For the silicidation to occur, the heat treatment temperature of at least 650° C. is required, and the temperature of 800° C. or more is preferable. Also, this temperature is preferably 1000° C. or less for preventing the diffusion of the impurities introduced in the silicon.

Figure 34C:
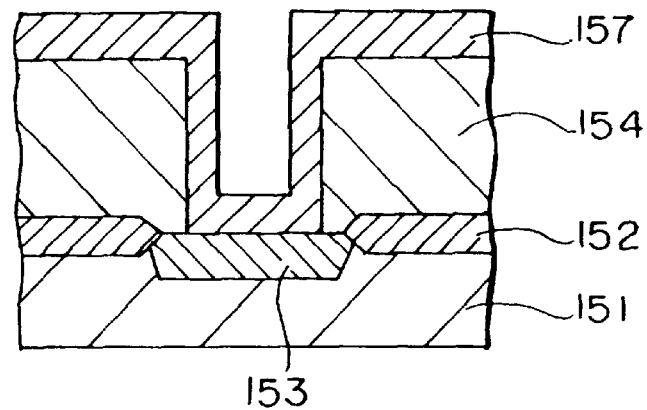
Figure 34D:
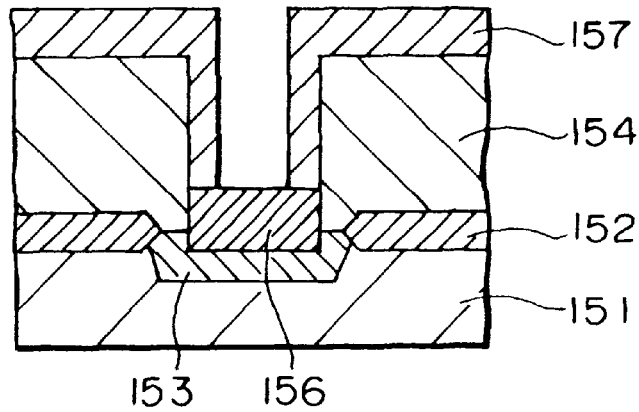

According to this embodiment, as shown in FIGS. 34C, 34D, the titanium film 157 formed in contact with the bottom of the contact hole 155 is entirely composed of a titanium silicide film.

As described above, in the case where the titanium film 157 is subjected to silicide reaction in its entirety, the thickness of the titanium silicide film, which is determined by the thickness of the titanium film 157, can be easily controlled.

Since the titanium nitride film and the titanium silicide film are deposited one on the other directly according to this embodiment, the internal stress of the titanium nitride film is higher than when the titanium film 157 is interposed between the titanium nitride film and the titanium silicide film.

The sectional view of a contact structure of a semiconductor device and a method of fabrication thereof according to another embodiment of the invention are shown in FIGS. 35, 36A to 36D.

Figure 36A:
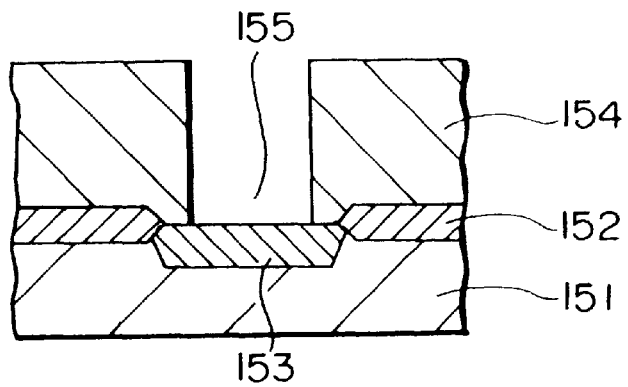
FIGS. 36A to 36D are diagrams showing the steps of fabricating a semiconductor device of FIG. 35.

(1) A device isolation region 152 and a device forming region 153 are formed on the silicon substrate 151. After forming a device on the device forming region 153, the insulating film 154 is formed on the device. This insulating film is composed of a silicon oxide, for example. The insulating film is formed with the contact hole 155 having a diameter of 0.4 μm or less in order to secure continuity with the device forming region (FIG. 36A).

(2) A polycrystal silicon film 161 is formed, for example, by the CVD (chemical vapor deposition) in such a manner as to contact the upper surface of the insulating film 154, each side wall of the insulating film in the contact hole 155 and the upper surface of the device forming region 153 on the bottom of the contact hole. The interior of the contact hole 155 is filled with the polycrystal silicon 161. After that, the polycrystal silicon film deposited on the upper surface of the insulating film 154 is removed by etching or the like method (FIG. 36B).

Figure 36B:
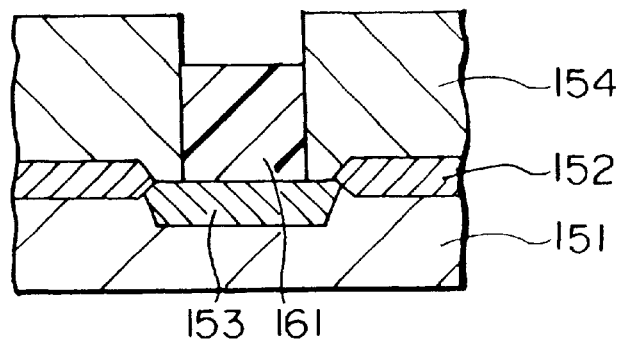
Figure 36C:
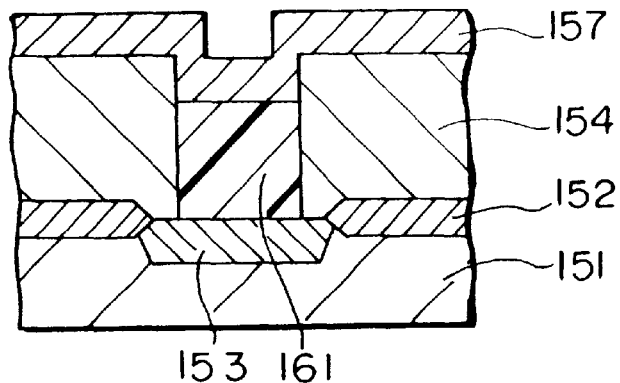

(3) A titanium film 157 is deposited to the thickness of 8 nm or more in a manner to contact the upper surface of the insulating film 154, each side wall of the insulating film in the contact hole 155 and the upper surface of the polycrystal silicon film 161 on the bottom of the contact hole (FIG. 36C).

Figure 36D:
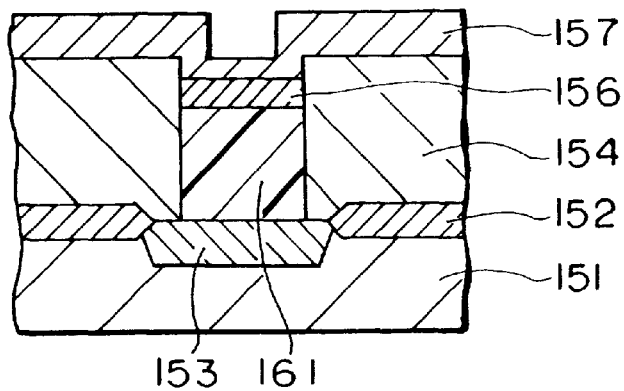

(4) Then, a titanium silicide film 156 is formed in the interface by the silicidation between the titanium film 157 and the polycrystal silicon film 161 by heat treatment. The titanium film 157 is formed with the thickness of 8 to 34 nm by this reaction. As a result, the thickness of the titanium silicide film 156 formed by heat treatment is 20 to 84 nm. The heat treatment temperature for forming silicide is at least 650° C. or more, or preferably 800° C. or more. Also, this temperature is preferably 1000° C. or less for preventing the diffusion of the impurities introduced into the silicon (FIG. 36D).

According to this embodiment, as shown in FIG. 36B, the process is required for depositing the polycrystal silicon film 161 in such a manner as to contact the upper surface of the insulating film 154, each side wall of the insulating film in the contact hole 155 and the upper surface of the device forming region 153 on the bottom of the contact hole. Since the interior of the contact hole 155 is filled with the polycrystal silicon 161, the depth of the contact hole 155 is decreased thereby to facilitate the deposition of the titanium film 157 in the next step.

With the reduction in the diameter of the contact hole, the aspect ratio (depth/diameter) of the contact hole tends to increase. It is therefore difficult to cover the wiring metal of a sufficient thickness on the sides and bottom of the contact hole by the conventional sputtering process.

The titanium film can be easily deposited to the thickness of 8 nm or more on the sides and bottom of the contact hole, however, by filling the polycrystal silicon in the contact hole and thereby reducing the depth of the contact hole by the CVD technique superior in step coverage.

Figure 35:
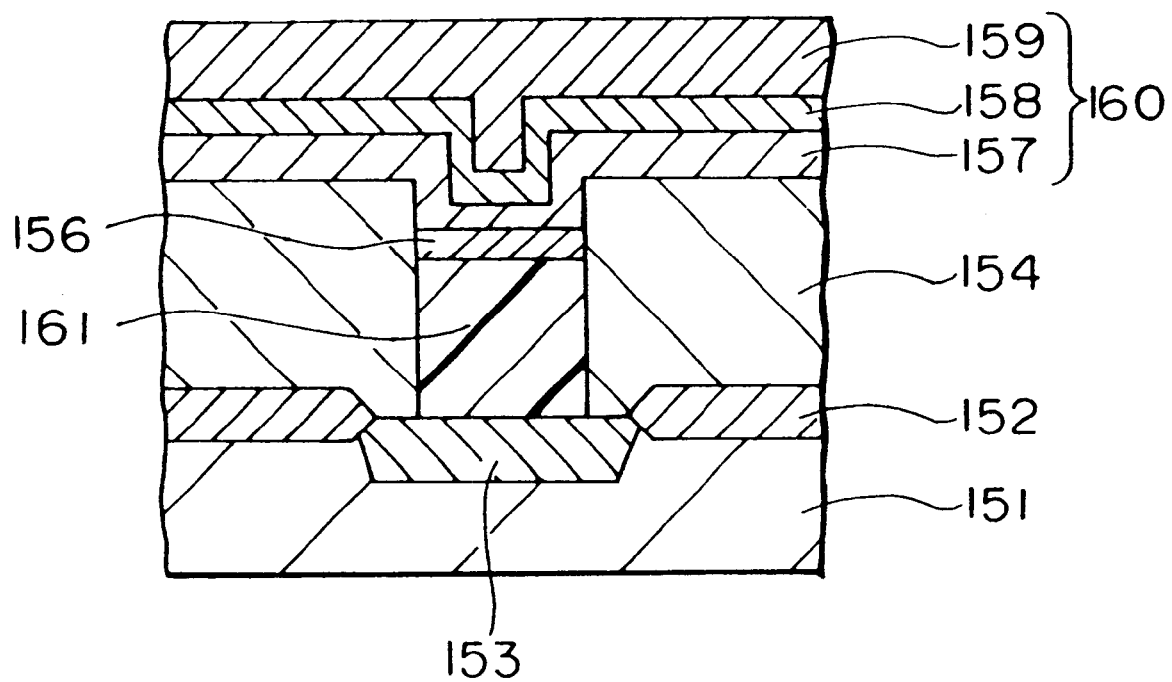
FIG. 35 is a diagram showing the contact structure of a semiconductor device according to a further embodiment of the invention.

Also, according to this embodiment, as shown in FIG. 35, the titanium film 157 not used for silicide reaction exists between the titanium nitride film and the titanium silicide film.

As described above, in the case where the titanium film 157 is interposed between the titanium nitride film and the titanium silicide film, the internal stress of the titanium nitride film can be reduced and the separation strength of the titanium nitride film can be increased more than when the titanium nitride film and the titanium silicide film are deposited directly one on the other.

For the titanium layer 157 to be interposed between the titanium nitride film and the titanium silicide layer, the thickness of the titanium layer 157 is required to be more than required for silicide reaction, and the temperature and time of heat treatment controlled to set the thickness of the titanium silicide film to 20 to 84 nm.

The semiconductor device according to this embodiment is such that the titanium silicide film 156 is formed in the interface between the electrical wiring metal film 160 and the polycrystal silicon 161 deposited directly on the silicon substrate 151. The upper surface of the titanium silicide film is deposited with the electrical wiring metal film 160 including the titanium film 157, the titanium nitride film 158 and the tungsten film 159. Also, the upper surface of the insulating film 154 is deposited with the titanium film 157, the titanium nitride film 158 and the tungsten film 159. The titanium film 157 is not necessarily left, but the titanium nitride film 158 may directly contact the upper surface of the insulating film 154. Also, the titanium nitride film 158 and the tungsten film 159 are not limited to the shown ones, but may be replaced with another conductive film or an insulating film with equal effect. Further, the lamination structure is not necessarily of different materials.

A sectional view of the contact structure of a semiconductor device and a method of fabrication thereof according to another embodiment are shown in FIGS. 37, 38A to 38D.

Figure 38A:
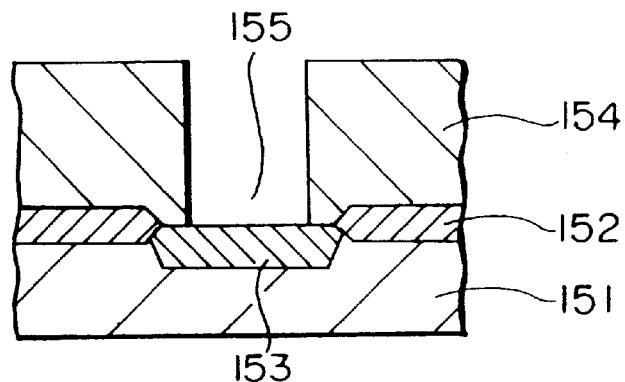
FIGS. 38A to 38D are diagrams showing the steps of fabricating the semiconductor device of FIG. 37.

(1) The device isolation region 152 and the device forming region 153 are formed on the silicon substrate 151. After forming a device in the device forming region 153, the upper surface of the device is formed with the insulating film 154. This insulating film 154 includes, for example, a silicon oxide. The insulating film 154 is formed with the contact hole 155 in order to assure continuity with the device forming region 153 (FIG. 38A).

Figure 38B:
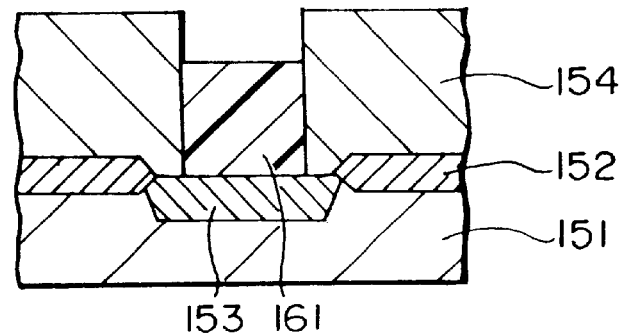
Figure 38C:
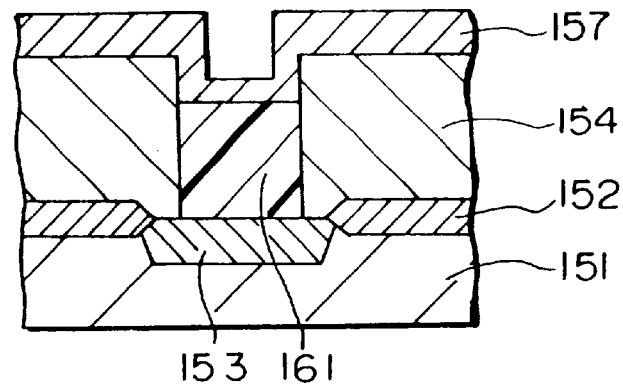
Figure 38D:
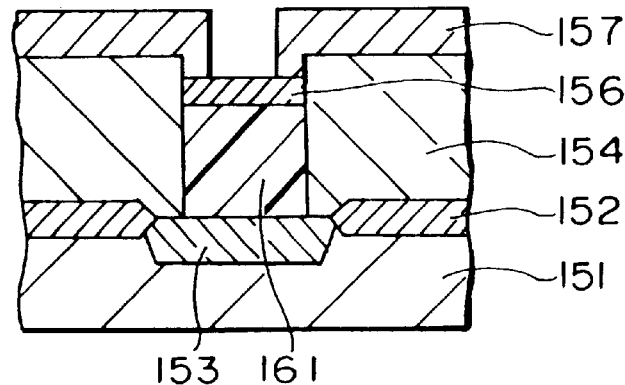

(2) The polycrystal silicon film 161 is deposited by the CVD (chemical vapor deposition) process, for example, in a manner to contact the upper surface of the insulating film 154, each side wall of the insulating film in the contact hole 155 and the upper surface of the device forming region 153 on the bottom of the contact hole, and the contact hole 155 is filled with the polycrystal silicon 161. After that, the polycrystal silicon film deposited on the upper surface of the insulating film 154 is removed by etching or the like (FIG. 38B).

(3) The titanium film 157 is deposited to the thickness of 8 to 34 nm in such a manner as to contact the upper surface of the insulating film 154, each side wall of the insulating film in the contact hole 155 and the upper surface of the device forming region 153 on the bottom of the contact hole 155.

(4) The titanium film 157 and the silicon of the device forming region 153 are subjected to silicide reaction by heat treatment of the silicon substrate 151 deposited with the titanium film 157 to the thickness of 8 to 34 nm thereby to form the titanium silicide film 156 in the interface.

The heat treatment temperature for forming the silicide is preferably at least 650° C. or preferably 800° C. or more. Also, this temperature is preferably 1000° C. or less for preventing the diffusion of the impurities introduced into the silicon.

According to this embodiment, as shown in FIG. 38B, the process is required to deposit the polycrystal silicon film 161 in such a manner as to contact the upper surface of the insulating film 154, the side walls of the insulating film in the contact hole 155 and the upper surface of the device forming region 153 on the bottom of the contact hole. Since the interior of the contact hole 155 is filled with the polycrystal silicon 161, the depth of the contact hole 155 is reduced, thereby facilitating the deposition of the titanium film 157 in the next step.

With the reduction in the diameter of the. contact hole, the aspect ratio (depth to diameter ratio) of the contact hole tends to increase. It is difficult therefore to cover the wiring metal of a sufficient thickness on the sides and bottom of the contact hole by the conventional sputtering process.

The titanium film can be easily deposited to the thickness of 8 nm or more on the sides and bottom of the contact hole, however, by filling the polycrystal silicon in the contact hole and reducing the depth of the contact hole by the CVD technique superior in step coverage.

Figure 37:
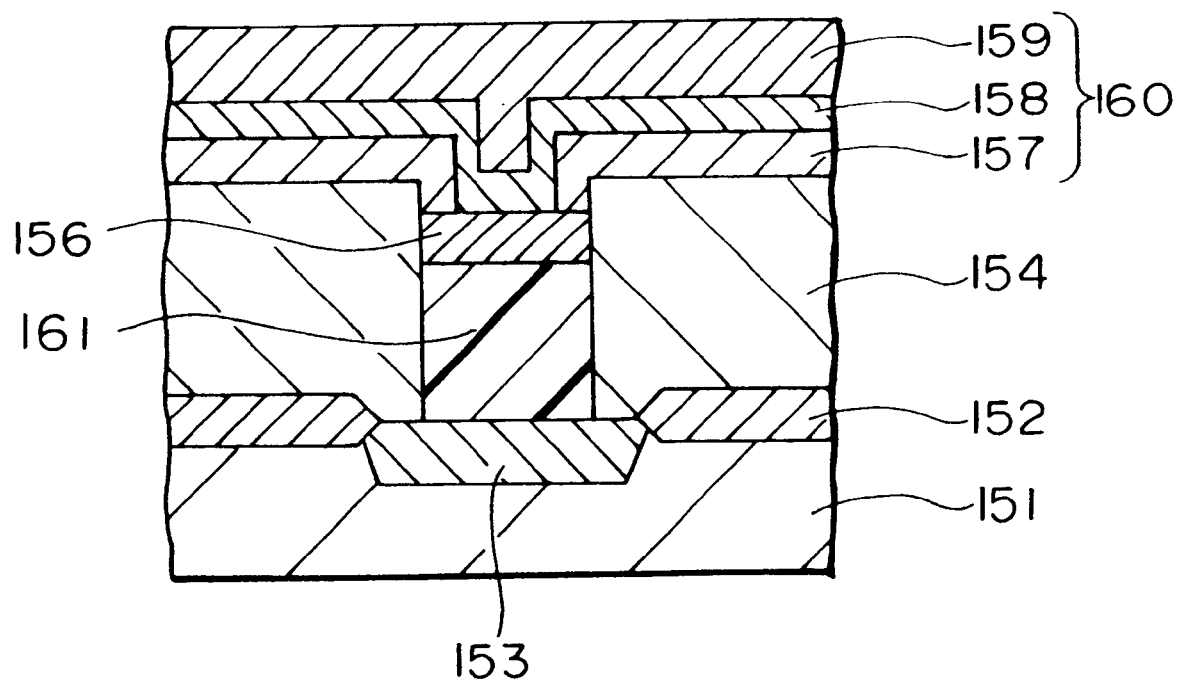
FIG. 37 is a diagram showing the contact structure of a semiconductor device according to another further embodiment of the invention.

Also, according to this embodiment, as shown in FIG. 37, the whole of the titanium film 157 constitutes a titanium silicide film.

In this way, in the case where the whole titanium film 157 is subjected to silicide reaction, the thickness of the titanium silicide film, which is determined by the thickness of the titanium film 157, can be easily controlled.

In this case, since the titanium nitride film and the titanium silicide film are directly deposited one on the other, the internal stress of the titanium nitride film is increased as compared with the case in which the titanium film 157 is interposed between the titanium nitride film and the titanium silicide film.

The contact section of the semiconductor device according to this embodiment is formed with the titanium silicide film 156 in the interface between the polycrystal silicon 161 deposited directly on the silicon substrate 151 and the electrical wiring metal film 160 in the contact hole 155. The upper surface of the titanium silicide film is formed with the electrical wiring metal film 160 including the titanium nitride film 158 and the tungsten film 159 deposited thereon. Also, the upper surface of the insulating film 154 is deposited with the titanium film 157, the titanium nitride film 158 and the tungsten film 159. The titanium film 157 is not necessarily left unremoved but may be in contact with the titanium nitride film 158 directly on the insulating film 154. Also, the titanium nitride film 158 and the tungsten film 159 are not necessarily limited to those mentioned above, but may take the form of another conductive or insulating film. Further, a lamination structure of different materials may be employed with equal effect.

A sectional view of the contact structure of a gate electrode of a MOS (metal oxide semiconductor) transistor and a method of fabrication thereof according to another embodiment of the invention are shown in FIGS. 39, 40A to 40D.

Figure 40A:
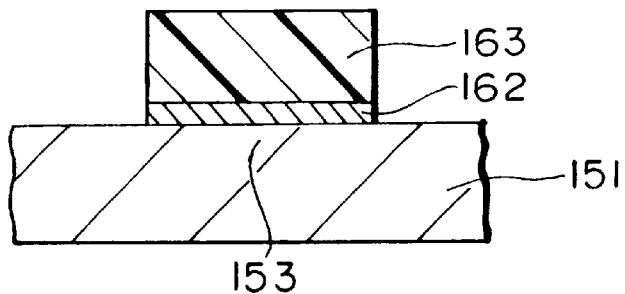
FIGS. 40A to 40D are diagrams showing the steps of fabricating a semiconductor device of FIG. 39.

(1) The silicon oxide film 162 is formed to the thickness of about 15 nm in the device forming region 153 on the silicon substrate 151. The silicon oxide film 162 is formed with a polycrystal silicon film by the CVD (chemical vapor deposition) process, and a resist pattern is formed by photolithography. With this pattern as a mask, the polycrystal silicon film and the silicon oxide film are patterned by dry etching thereby to form the polycrystal silicon gate electrode 163. The gate electrode of the MOS structure is constructed of a three-layer configuration of the silicon substrate 151, the silicon oxide film 162 and the polycrystal silicon gate electrode 163 (FIG. 40A).

Figure 40B:
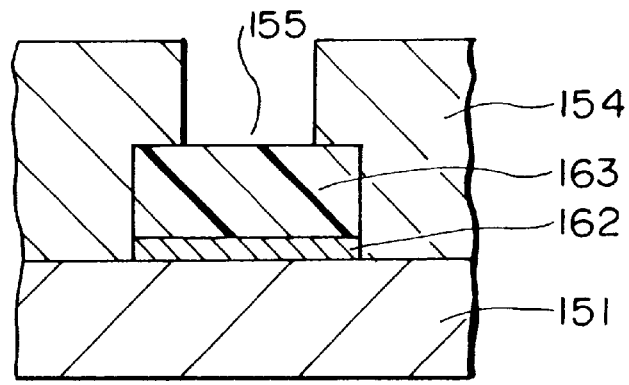

(2) The insulating film 154 is deposited over the entire upper surface of the silicon substrate 151 and over the entire upper surface of the gate electrode 163, and the contact hole 155 is formed in such a manner as to reach the gate electrode in order to assure continuity with the gate electrode 163 (FIG. 40B).

Figure 40C:
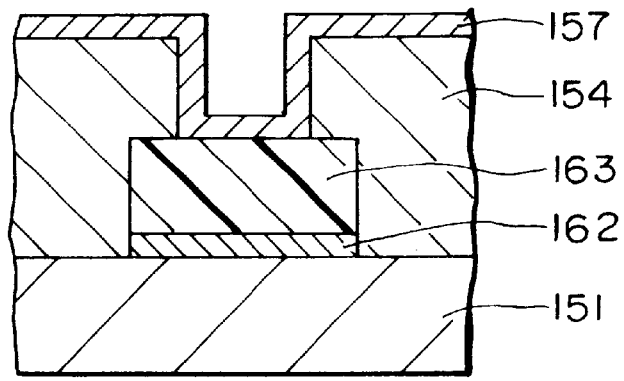

(3) The titanium film 157 is deposited on the upper surface of the insulating film 154 and in such a manner as to contact the gate electrode 163 in the contact hole 155 (FIG. 40C).

Figure 40D:
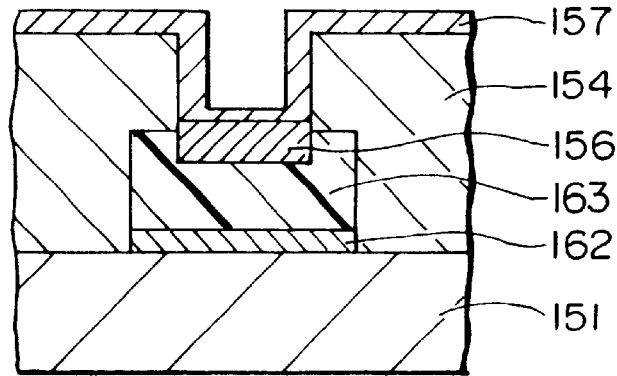

(4) After that, the titanium silicide film 156 is formed in the interface by the silicidation caused between the titanium film 157 and the silicon of the gate electrode 163 by heat treatment. In the process, the thickness of the titanium film 157 subjected to reaction is set to 8 to 34 nm. By this, the thickness of the titanium silicide film 156 formed by the heat treatment is 20 to 84 nm. The heat treatment temperature for forming silicide is preferably at least 650° C. or more/more preferably, 800° C. or more. Also, this temperature is preferably 1000° C. or less for preventing the diffusion of the impurities introduced into the silicon (FIG. 40D).

Figure 39:
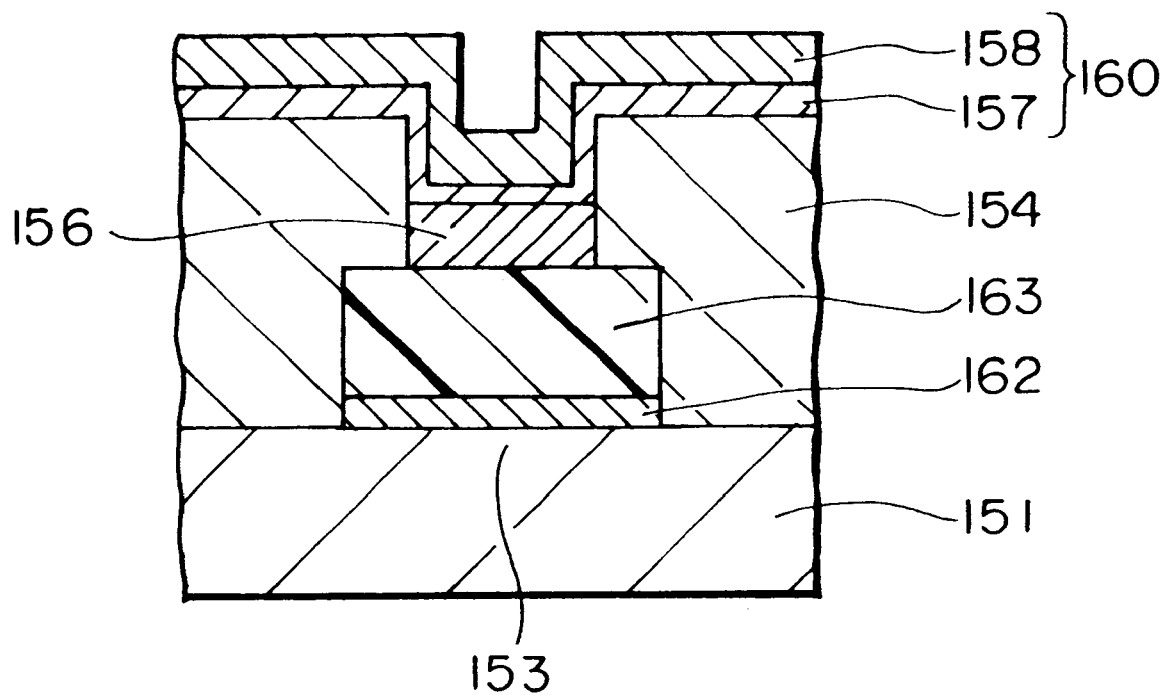
FIG. 39 is a diagram showing the contact structure of a semiconductor device according to a still further embodiment of the invention.

According to this embodiment, as shown in FIG. 39, the titanium film 157 not used for silicide reaction is interposed between the titanium nitride film and the titanium silicide film.

As described above, the interposition of the titanium film 157 between the titanium nitride film and the titanium silicide film reduces the internal stress of the titanium nitride film and increases the separation strength of the titanium nitride film more than when the titanium nitride film and the titanium silicide film are directly deposited one on the other.

For the titanium layer 157 to exist between the titanium nitride film and the titanium silicide film, the thickness of the titanium layer 157 is required to be more than sufficient for silicide reaction, and the thickness of the titanium silicide film is controlled to 20 to 84 nm by controlling the temperature and time of heat treatment.

The contact section of the semiconductor device according to this embodiment is such that the titanium silicide film 156 is formed in the interface between the electrical wiring metal film 160 and the gate electrode 163 made of polycrystal silicon in the contact hole 155. FIGS. 39 and 40A to 40D show the case in which the upper surface of the titanium silicide film 156 is formed with the electrical wiring metal film 160 including the unreacting titanium film 157 and the titanium nitride 158 thereon. In spite of this, the upper surface of the gate electrode 163 may be deposited with the titanium film 157 to the thickness of 8 to 34 nm and also with the titanium silicide film 156 in such a manner as to consume the entire titanium film, and the upper surface of the titanium silicide film 156 is not necessarily left with the titanium film 157. Also, the upper surface of the insulating film 154 may be in contact directly with the titanium nitride film 158. The titanium nitride film 158 is not limited to the one shown above, but any other conductive film or insulating film may be used in that place. Also, a lamination structure of different materials is not necessarily required.

A sectional view of a gate electrode contact structure of a MOS transistor and a method of fabrication thereof according to another embodiment of the invention are shown in FIGS. 41, 42A to 42D.

Figure 42A:
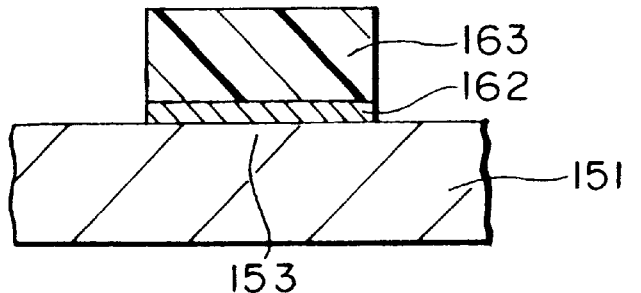
FIGS. 42A to 42D are diagrams showing the steps of fabricating the semiconductor device of FIG. 41.

Specifically, (1) A silicon oxide film 162 is formed to the thickness of about 15 nm in the device forming region 153 of the upper surface of the silicon substrate 151. A polycrystal silicon film is formed by the CVD process on the silicon oxide film 162, and a resist pattern is formed by photolithography. With this pattern as a mask, the polycrystal silicon film and the silicon oxide film are patterned by the dry etching thereby to form the polycrystal silicon gate electrode 163 (FIG. 42A).

(2) The insulating film 154 is deposited over the entire upper surface of the gate electrode 163 and over the upper surface of the silicon substrate 151, and in order to assure continuity with the gate electrode 163, the contact hole 155 is formed in such a manner as to reach the gate electrode. The polycrystal silicon film 161 is deposited by the CVD, for example, in such a manner as to contact the upper surface of the gate electrode 163 on the bottom surface of the contact hole, the upper surface of the insulating film 154 and the side walls of the insulating film in the contact hole 155. The interior of the contact hole 155 is filled with the polycrystal silicon 161. After that, the polycrystal silicon film deposited on the upper surface of the insulating film 154 is removed by etching or the like method (FIG. 42B).

Figure 42B:
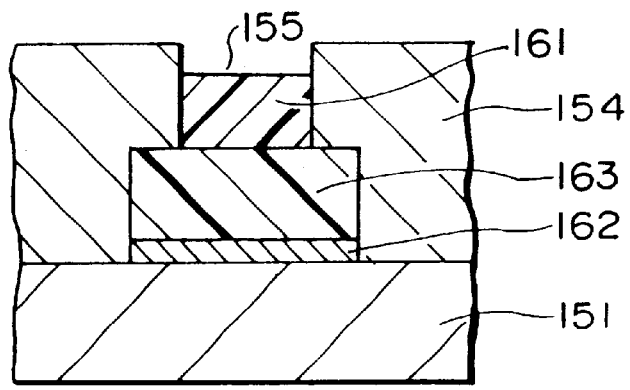
Figure 42C:
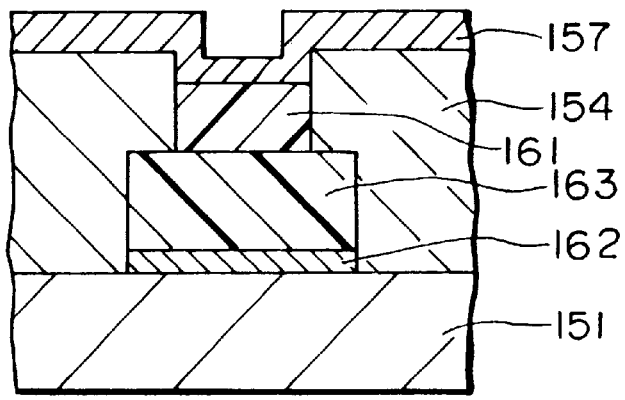
Figure 42D:
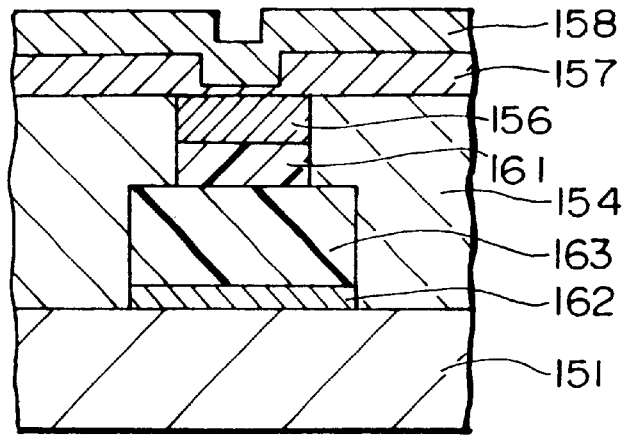

(3) The titanium film 157 is deposited over the entire upper surface of the insulating film 154 and over the entire upper surface of the polycrystal silicon film 161 (FIG. 42C).

(4) After that, the titanium silicide film 156 is formed in the interface by the silicidation caused between the titanium film 157 and the polycrystal silicon 161 by heat treatment. In the process, the titanium film 157 is caused to react with the thickness of 8 to 34 nm. By this, the thickness of the titanium silicide film 156 formed by the heat treatment is 20 to 84 nm. The temperature of the heat treatment for forming the silicide is at least 650° C. or more, or preferably at least 800° C. or more. This temperature is preferably not more than 1000° C. for preventing the diffusion of the impurities introduced into the silicon.

According to this embodiment, as shown in FIG. 42B, the process is required to deposit the polycrystal silicon film 161 in such a manner as to contact the side walls of the insulating film in the contact hole 155, the upper surface of the insulating film 154 and the upper surface of the device forming region 153 on the bottom of the contact hole. As a result of filling the polycrystal silicon 161 in the contact hole 155, the depth of the contact hole 155 is reduced thereby to facilitate the deposition of the titanium film 157 in the next step.

With the reduction in diameter of the contact hole, the aspect ratio of the contact hole (depth to diameter ratio) tends to increase. According to the conventional sputtering process, therefore, it is difficult to cover the wiring metal of sufficient thickness on the sides and bottom of the contact hole.

It is, however, easy to deposit the titanium film to the thickness of 8 nm or more on the sides and bottom of the contact hole by filling the polycrystal silicon in the contact hole by the CVD technique superior in step coverage and thus reducing the depth of the contact hole.

Figure 41:
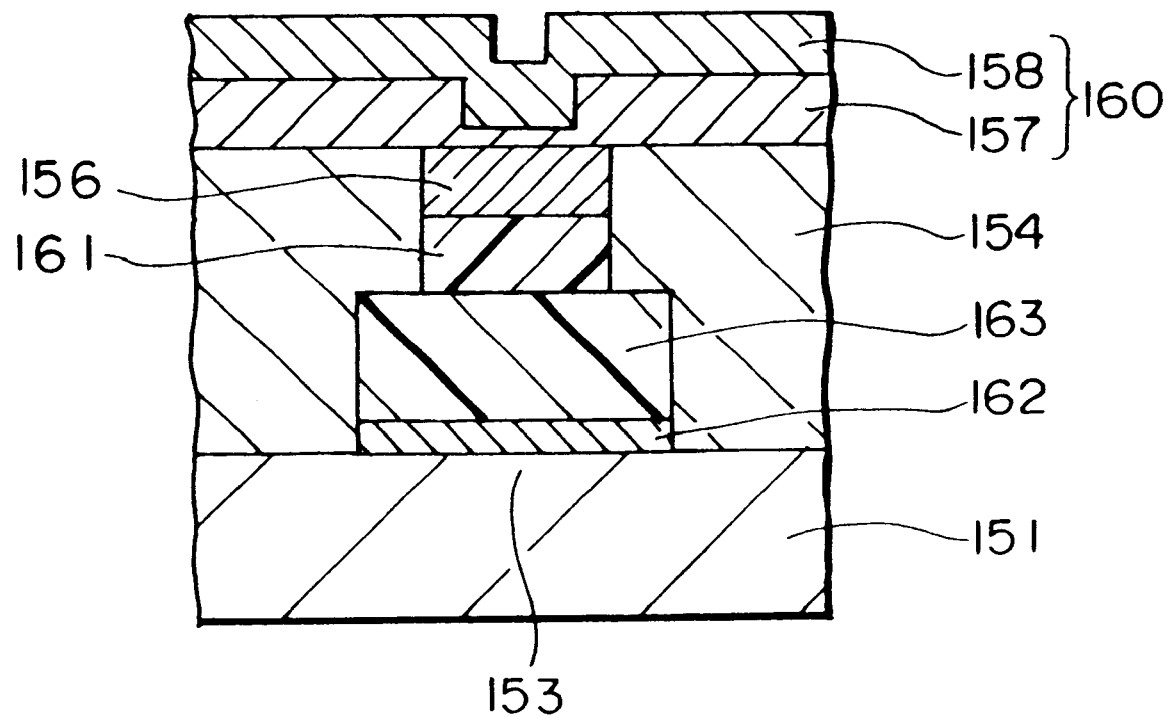
FIG. 41 is a diagram showing the contact structure of a semiconductor device according to a still another embodiment of the invention.

Also, according to this embodiment, as shown in FIG. 41, the titanium film 157 not used for silicide reaction remains between the titanium nitride film and the titanium suicide film.

In the case where the titanium film 157 is left between the titanium nitride film and the titanium silicide film as described above, the internal stress of the titanium nitride film is reduced and the separation strength of the titanium nitride film is increased more than when the titanium nitride film and the titanium silicide film are deposited directly one on the other.

In order for the titanium layer 157 to exist between the titanium nitride film and the titanium silicide film, the thickness of the titanium layer 157 is required to be more than sufficient to cause silicide reaction, and the thickness of the titanium silicide film is required to be controlled to 20 to 84 nm by controlling the temperature and time of heat treatment.

The contact section of the semiconductor device according to this embodiment is such that the titanium silicide film 156 is formed in the interface between the electrical wiring metal film 160 and the polycrystal silicon 161 filled in such a manner as to contact the gate electrode 163 in the contact hole 155. FIGS. 41, 42A to 42D show the case in which the upper surface of the titanium silicide film 156 is deposited with the electrical wiring metal film 160 including the unreacting titanium film 157 and the titanium nitride film 158. Instead, the titanium film 157 having a thickness of 8 to 34 nm may be deposited on the upper surface of the gate electrode 163, and the titanium silicide film 156 may be formed in such a manner as to consume the entire titanium film so that the titanium film 157 is not left on the upper surface of the titanium silicide film 156. Also, the titanium film 158 may be in direct contact with the upper surface of the insulating film 154. The titanium nitride 158 is not limited to the shown one, but may take the form of another conductive film or another insulating film. Further, a lamination structure is not necessarily of different materials. The thickness of the titanium silicide 156 is 20 to 84 nm.

Figure 43A:
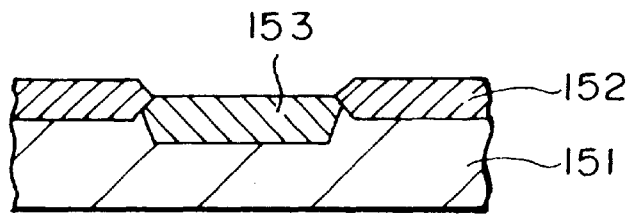
FIGS. 43A to 43D are diagrams showing the steps of fabricating a semiconductor device according to an even further embodiment of the invention.

The embodiments were explained above with reference to the case in which the fabrication include the process in which a titanium silicide film is formed by depositing the titanium film 157 in such a manner as to contact the single-crystal silicon substrate 151 or the polycrystal silicon 161 and then by heat treatment. The fabrication process according to each embodiment, however, is not limited to the one explained above, but as shown in FIGS. 43A to 43D, the heat treatment may be conducted after forming the electrical wiring metal film 160. More specifically, (1) The device isolation region 152 and the device forming region 153 are formed on the silicon substrate 151 (FIG. 43A).

Figure 43B:
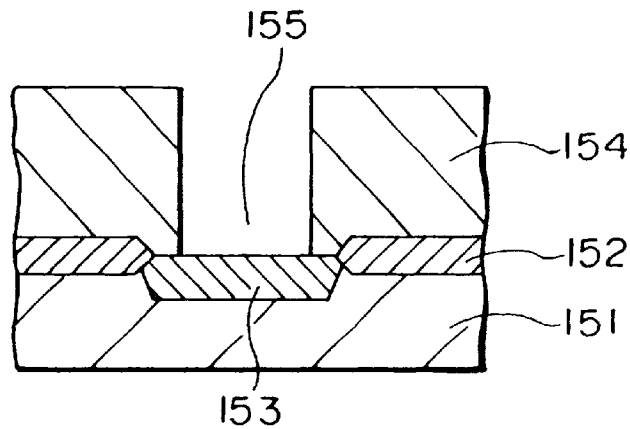

(2) After forming a device in the device forming region 153 the upper surf ace thereof is formed with the insulating film 154. This insulating film is composed of silicon oxide, for example. This insulating film is formed with the contact hole 155 in order to assure continuity with the device forming region (FIG. 43B).

Figure 43C:
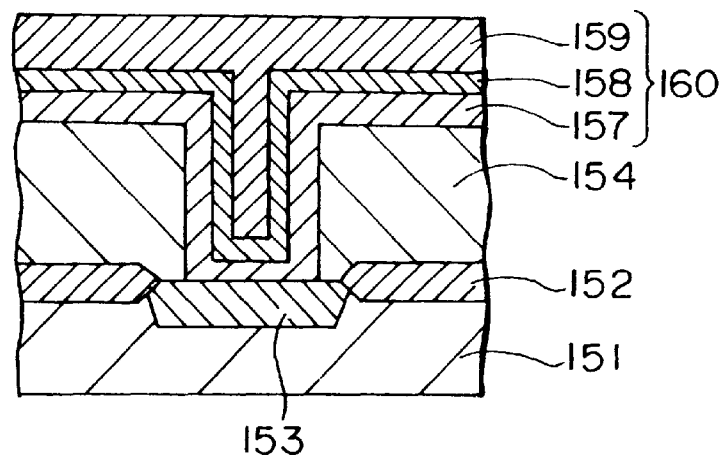

(3) The titanium film 157 is deposited in such a manner as to contact the upper surface of the insulating film 154, the side walls of the insulating film in the contact hole 155 and the upper surface of the device forming region 153 on the bottom of the contact hole. Further, the upper surface of the titanium film 157 is deposited with the titanium nitride film 158 and the tungsten film 159. The titanium nitride film 158 and the tungsten film 159 are not limited to the described ones, but may take the form of another conductive or insulating film (FIG. 43C).

(4) The titanium silicide film 156 is formed in the interface by heat treatment and the resulting silicide reaction between the titanium film 157 and the device forming region 153. The titanium film 157 having a thickness of 8 to 34 nm is caused to react. As a result, the titanium silicide film 156 formed by heat treatment has a thickness of 20 to 84 nm. A preferable temperature of heat treatment for forming silicide is at least 650° C., or more preferably 800° C. or more. Also, this temperature is preferably not more than 1000° C. in order to prevent the diffusion of the impurities introduced into the silicon (FIG. 43D).

In the case where the thickness of the titanium silicide film 156 is set to 20 to 84 nm, the contact resistance value between silicon and titanium can be reduced while at the same time reducing the average stress generated in the interface between silicon and titanium silicide to less than the critical breakdown stress level, thereby providing a superior contact free of separation of the titanium silicide film.

Figure 43D:
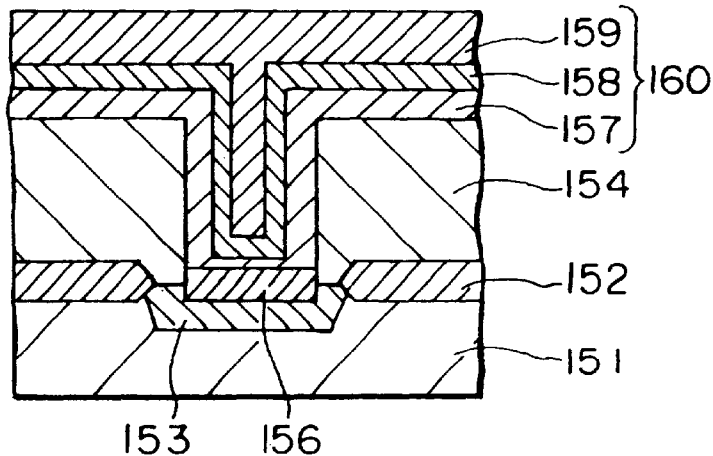

FIG. 43D showed the case in which the upper surface of the titanium silicide film 156 is deposited with the electrical wiring metal film 160 including the unreacting titanium film 157, the titanium nitride film 158 and the tungsten film 159. Instead, the titanium film 157 may be deposited to the thickness of 8 to 34 nm in such a manner as to contact the device forming region 153 on the silicon substrate 151 and also the titanium silicide film 156 is formed in such a manner as to consume the entire titanium film, so that the titanium film 157 is not left on the upper surface of the titanium silicide film 156. Also, the titanium film 158 may be formed in direct contact on the insulating film 4. The titanium nitride film 158 and the tungsten film 159 are not limited to those shown above, but another conductive or insulating film may be used in place with equal effect. Further, a lamination structure is not necessarily of different materials. The thickness of the titanium silicide film 156 is 20 to 84 nm.

What is claimed is:

1. A method of fabricating a semiconductor integrated circuit device, comprising the steps of:

forming a memory cell-selecting MISFET and a MISFET for a peripheral circuit on a semiconductor substrate and then forming an information storage capacitor above said memory cell-selecting MISFET;

forming a bit line contact hole in an insulating film covering said memory cell, filling a polycrystalline silicon plug of the same conductivity type as the semiconductor region of said memory cell-selecting MISFET in said bit line contact hole, and then forming a contact hole in the insulating film covering said MISFET of said peripheral circuit;

depositing a Ti film and a TiN film on said insulating film;

forming by annealing a first titanium silicide layer having a thickness of 120 nm or less on the surface of said polycrystalline silicon plug in said bit line contact hole, and a second titanium silicide layer having a thickness of 10 nm or more on the surface of the semiconductor region of said MISFET exposed to the bottom of said contact hole of said peripheral circuit; and depositing a W film on said TiN film, and patterning said W film and the underlying TiN film and the underlying Ti film thereby to form a bit line and said wiring line of said peripheral circuit composed of a lamination of the W—TiN—Ti film at the same time.

2. A method of fabricating a semiconductor integrated circuit device according to claim 1, wherein said step of forming said titanium silicide layer includes the step of forming said second titanium silicide layer to the thickness of 20 nm or more.

3. A method of fabricating a semiconductor integrated circuit device according to claim 1, wherein said step of depositing said Ti film and said TiN film includes the step of depositing said Ti film and said TiN film continuously in an inert gas environment.

4. A method of fabricating a semiconductor integrated circuit device according to claim 1, wherein said step of depositing said Ti film and said TiN film includes the step of depositing said Ti film by selected one of the collimator sputtering and the low-pressure long-distance sputtering.

5. A method of fabricating a semiconductor integrated circuit device for forming a polycrystalline silicon plug of the same conductivity type as a first semiconductor region of a first region in a first contact hole connecting said first semiconductor region of said first region to a first wiring, said first region being relatively high and said second region being relatively low on the main surface of a semiconductor substrate, said second wiring being connected to a second semiconductor region of said second region through a second contact hole, said second wiring and said first wiring being formed of a W—TiN—Ti film in the same wiring layer, said method comprising the steps of:

forming said first contact hole in the insulating film covering said first region and filling said polycrystalline silicon plug of the same conductivity type as said first semiconductor region of said first region in said first contact hole;

forming said second contact hole in the insulating film covering said second region;

depositing a Ti film and a TiN film on said insulating film, and forming by annealing a first titanium silicide layer having a thickness of 120 nm or less on the surface of said polycrystalline silicon plug in said first contact hole, and also a second titanium silicide layer having a thickness of 10 nm or more on the surface of said second semiconductor region exposed to the bottom of said second contact hole; and depositing a w film on said TiN film, and patterning said W film and said underlying TiN film and said underlying Ti film thereby to form a first wiring and a second wiring composed of a lamination of a W—TiN—Ti film at the same time.

6. A method of fabricating a semiconductor device, comprising:

forming an insulating film on a silicon substrate;

forming a contact hole in said insulating film;

depositing a titanium film in contact with said silicon substrate in said contact hole; and causing said titanium film and said silicon substrate to react with each other by heat treatment, thereby subjecting said titanium film to silicide reaction with the thickness of 4 nm to 48 nm.

7. A method of fabricating a semiconductor device according to claim 6, wherein a process resulting in said silicide reaction includes subjecting said titanium film to silicide reaction with the thickness of 8 nm to 34 nm.

8. A method of fabricating a semiconductor device according to claim 6, wherein the depositing of said titanium film includes a process of depositing said titanium film so as to contact an upper surface of an active region of said silicon substrate on the bottom of said contact hole and on each side wall of said insulating film in said contact hole and on an upper surface of said insulating film.

9. A method of fabricating a semiconductor device according to claim 8, wherein the depositing of said titanium film is included in a process of forming a multilayer wiring metal film included in said semiconductor device, said titanium film constituting the lowermost layer of said multilayer wiring metal film and being separated from other ones of said multilayer wiring metal film via a barrier film.

10. A method of fabricating a semiconductor device according to claim 9, wherein a process resulting in said silicide reaction includes subjecting said titanium film to silicide reaction with the thickness of 8 nm to 34 nm.

11. A method of fabricating a semiconductor device according to claim 9, wherein the process of said silicide reaction is effected after the depositing of said titanium film in said contact hole but before depositing additional film layers in the process of forming said multilayer wiring metal film.

12. A method of fabricating a semiconductor device according to claim 9, wherein the process of said silicide reaction is effected after completion of the process of forming said multilayer wiring metal film.

13. A method of fabricating a semiconductor device according to claim 8, wherein a process resulting in said silicide reaction includes subjecting said titanium film to silicide reaction with the thickness of 8 nm to 34 nm.

14. A method of fabricating a semiconductor device according to claim 6, wherein the depositing of said titanium film is included in a process of forming a multilayer wiring metal film included in said semiconductor device, said titanium film constituting the lowermost layer of said multilayer wiring metal film and being separated from other ones of said multilayer wiring metal film via a barrier film.

15. A method of fabricating a semiconductor device according to claim 14, wherein a process resulting in said silicide reaction includes subjecting said titanium film to silicide reaction with the thickness of 8 nm to 34 nm.

16. A method of fabricating a semiconductor device according to claim 14, wherein the process of said silicide reaction is effected after the depositing of said titanium film in said contact hole but before depositing additional film layers in the process of forming said multilayer wiring metal film.

17. A method of fabricating a semiconductor device according to claim 14, wherein the process of said silicide reaction is effected after completion of the process of forming said multilayer wiring metal film.

18. A method of fabricating a semiconductor device, comprising:

forming an insulating film on a silicon substrate;

forming a contact hole in said insulating film;

filling polycrystal silicon in said contact hole;

depositing a titanium film in contact with said polycrystal silicon in said contact hole; and causing said titanium film and said polycrystal silicon to react with each other by heat treatment, thereby subjecting said titanium film to silicide reaction with the thickness of 4 nm to 48 nm.

19. A method of fabricating a semiconductor device according to claim 18, wherein a process resulting in said silicide reaction includes subjecting said titanium film to silicide reaction with the thickness of 8 nm to 34 nm.

20. A method of fabricating a semiconductor device according to claim 18, wherein the depositing of said titanium film includes a process of depositing said titanium film so as to contact an upper surface of the polycrystal silicon in said contact hole and on each side wall of said insulating film in said contact hole and on an upper surface of said insulating film.

21. A method of fabricating a semiconductor device according to claim 20, wherein the depositing of said titanium film is included in a process of forming a multilayer wiring metal film included in said semiconductor device, said titanium film constituting the lowermost layer of said multilayer wiring metal film and being separated from other ones of said multilayer wiring metal film via a barrier film.

22. A method of fabricating a semiconductor device according to claim 21, wherein a process resulting in said silicide reaction includes subjecting said titanium film to silicide reaction with the thickness of 8 nm to 34 nm.

23. A method of fabricating a semiconductor device according to claim 20, wherein a process resulting in said silicide reaction includes subjecting said titanium film to silicide reaction with the thickness of 8 nm to 34 nm.

24. A method of fabricating a semiconductor device according to claim 18, wherein the depositing of said titanium film includes a process of depositing said titanium film so as to contact an upper surface of the polycrystal silicon in said contact hole and on each side wall of said insulating film in said contact hole and on an upper surface of said insulating film.

25. A method of fabricating a semiconductor device according to claim 24, wherein a process resulting in said silicide reaction includes subjecting said titanium film to silicide reaction with the thickness of 8 nm to 34 nm.

26. A method of fabricating a semiconductor device, comprising:

forming an insulating film on a silicon body having at least a MISFET formed thereon;

forming a contact hole in said insulating film exposing an active region of said MISFET at a principal surface of said silicon body;

depositing a titanium film in contact with said active region in said contact hole, and causing said titanium film and said active region to react with each other by heat treatment, thereby subjecting said titanium film to silicide reaction with the thickness of 4 nm to 48 nm.

27. A method of fabricating a semiconductor device according to claim 26, wherein a process resulting in said silicide reaction includes subjecting said titanium film to silicide reaction with the thickness of 8 nm to 34 nm.

28. A method of fabricating a semiconductor device according to claim 26, wherein the depositing of said titanium film is included in a process of forming a multilayer wiring metal film included in said semiconductor device, said titanium film constituting the lowermost layer of said multilayer wiring metal film and being separated from other ones of said multilayer wiring metal film via a barrier film.

29. A method of fabricating a semiconductor device according to claim 28, wherein the process of said silicide reaction is effected after the depositing of said titanium film in said contact hole but before depositing additional film layers in the process of forming said multilayer wiring metal film.

30. A method of fabricating a semiconductor device according to claim 28, wherein the process of said silicide reaction is effected after completion of the process of forming said multilayer wiring metal film.

31. A method of fabricating a semiconductor device, comprising:

forming an insulating film on a silicon body having at least a MISFET formed thereon;

forming a contact hole in said insulating film exposing an active region of said MISFET at a principal surface of said silicon body;

filling polycrystal silicon, having a same conductivity type as said active region, in said contact hole;

depositing a titanium film in contact with said polycrystal silicon in said contact hole; and causing said titanium film and said polycrystal silicon to react with each other by heat treatment, thereby subjecting said titanium film to silicide reaction with the thickness of 4 nm to 48 nm.

32. A method of fabricating a semiconductor device according to claim 31, wherein a process resulting in said silicide reaction includes subjecting said titanium film to silicide reaction with the thickness of 8 nm to 34 nm.

* * * * *